United States Patent
Cui et al.

(10) Patent No.: US 11,508,585 B2
(45) Date of Patent: Nov. 22, 2022

(54) METHODS FOR CHEMICAL MECHANICAL POLISHING AND FORMING INTERCONNECT STRUCTURE

(71) Applicant: TAIWAN SEMICONDUCTOR MANUFACTURING COMPANY LTD., Hsinchu (TW)

(72) Inventors: Ji Cui, Bolingbrook, IL (US); Fu-Ming Huang, Changhua County (TW); Ting-Kui Chang, New Taipei (TW); Tang-Kuei Chang, Tainan (TW); Chun-Chieh Lin, Hsinchu (TW); Wei-Wei Liang, Hsinchu (TW); Liang-Guang Chen, Hsinchu (TW); Kei-Wei Chen, Tainan (TW); Hung Yen, Kaohsiung (TW); Ting-Hsun Chang, Kaohsiung (TW); Chi-Hsiang Shen, Tainan (TW); Li-Chieh Wu, Hsinchu (TW); Chi-Jen Liu, Taipei (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 59 days.

(21) Appl. No.: 16/902,180

(22) Filed: Jun. 15, 2020

(65) Prior Publication Data
US 2021/0391186 A1 Dec. 16, 2021

(51) Int. Cl.
*H01L 21/321* (2006.01)
*C09G 1/02* (2006.01)
(Continued)

(52) U.S. Cl.
CPC ........ *H01L 21/3212* (2013.01); *B24B 37/044* (2013.01); *B24B 37/107* (2013.01); *C09G 1/02* (2013.01)

(58) Field of Classification Search
CPC ............. H01L 21/3212; H01L 21/7684; H01L 21/76846; H01L 21/76877; H01L 23/5283;
(Continued)

(56) References Cited

U.S. PATENT DOCUMENTS

| 6,232,228 B1 * | 5/2001 | Kwag | .................... C09K 13/04 |
| | | | 216/109 |
| 6,706,632 B2 * | 3/2004 | Sinha | ...................... H01L 28/60 |
| | | | 257/296 |

(Continued)

*Primary Examiner* — Binh X Tran
*Assistant Examiner* — Christopher Remavege
(74) *Attorney, Agent, or Firm* — WPAT Law; Anthony King

(57) ABSTRACT

A method for CMP includes following operations. A dielectric structure is received. The dielectric structure includes a metal layer stack formed therein. The metal layer stack includes at least a first metal layer and a second metal layer, and the first metal layer and the second metal layer are exposed through a surface of the dielectric structure. A first composition is provided to remove a portion of the first metal layer from the surface of the dielectric structure. A second composition is provided to form a protecting layer over the second metal layer. The protecting layer is removed from the second metal layer. A CMP operation is performed to remove a portion of the second metal layer. In some embodiments, the protecting layer protects the second metal layer during the removal of the portion of the first metal layer.

20 Claims, 24 Drawing Sheets

(51) Int. Cl.
*B24B 37/10* (2012.01)
*B24B 37/04* (2012.01)

(58) Field of Classification Search
CPC ......... H01L 23/53238; H01L 23/53242; H01L 21/76858; H01L 2221/1068; H01L 23/528; B24B 37/044; B24B 37/107; C09G 1/02

See application file for complete search history.

(56) References Cited

U.S. PATENT DOCUMENTS

| | | | | |
|---|---|---|---|---|
| 7,226,863 B2* | 6/2007 | Sinha | ...................... | H01L 28/60 438/690 |
| 7,585,782 B2* | 9/2009 | Greeley | ............ | H01L 21/76865 257/E21.582 |
| 8,304,342 B2* | 11/2012 | Pas | ................... | H01L 21/31053 438/651 |
| 9,299,585 B2* | 3/2016 | Wang | ....................... | C09G 1/02 |
| 2006/0163206 A1* | 7/2006 | Belov | .................. | C09K 3/1454 216/88 |
| 2007/0238287 A1* | 10/2007 | Greeley | ............ | H01L 21/76883 257/E21.309 |
| 2009/0093100 A1* | 4/2009 | Xia | ................... | H01L 21/76832 438/421 |
| 2010/0087065 A1* | 4/2010 | Boggs | ................. | H01L 21/3212 438/692 |
| 2018/0273802 A1* | 9/2018 | Granstrom | ............... | C09K 3/14 |
| 2018/0294180 A1* | 10/2018 | Jiang | ................. | H01L 21/76877 |
| 2019/0300749 A1* | 10/2019 | Lin | ....................... | B24B 37/044 |
| 2020/0098590 A1* | 3/2020 | Hsu | ........................ | C09G 1/02 |
| 2021/0217698 A1* | 7/2021 | Cheng | ............... | H01L 23/53257 |
| 2021/0253904 A1* | 8/2021 | Huang | .............. | H01L 21/30625 |

\* cited by examiner

METHODS FOR CHEMICAL MECHANICAL POLISHING AND FORMING INTERCONNECT STRUCTURE

BACKGROUND

Chemical mechanical polishing (CMP) is widely used in the fabrication of integrated circuits. As an integrated circuit is built layer by layer on a surface of a semiconductor wafer, CMP is used to planarize the topmost layer or layers to provide a level surface for subsequent fabrication operations. CMP is carried out by placing the semiconductor wafer in a wafer carrier that presses the wafer surface to be polished against a polishing pad attached to a platen. The platen and the wafer carrier are counter-rotated while an abrasive slurry containing both abrasive particles and reactive chemicals is applied to the polishing pad. The slurry is transported to the wafer surface via the rotation of the polishing pad. The relative movement of the polishing pad and the wafer surface coupled with the reactive chemicals in the abrasive slurry allows CMP to level the wafer surface by means of both physical and chemical actions.

CMP can be used at a number of points during the fabrication of an integrated circuit. For example, CMP can be used to planarize the inter-level dielectric layers that separate the various circuit layers in an integrated circuit. CMP can also be commonly used in the formation of the metal lines that interconnect components of an integrated circuit.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
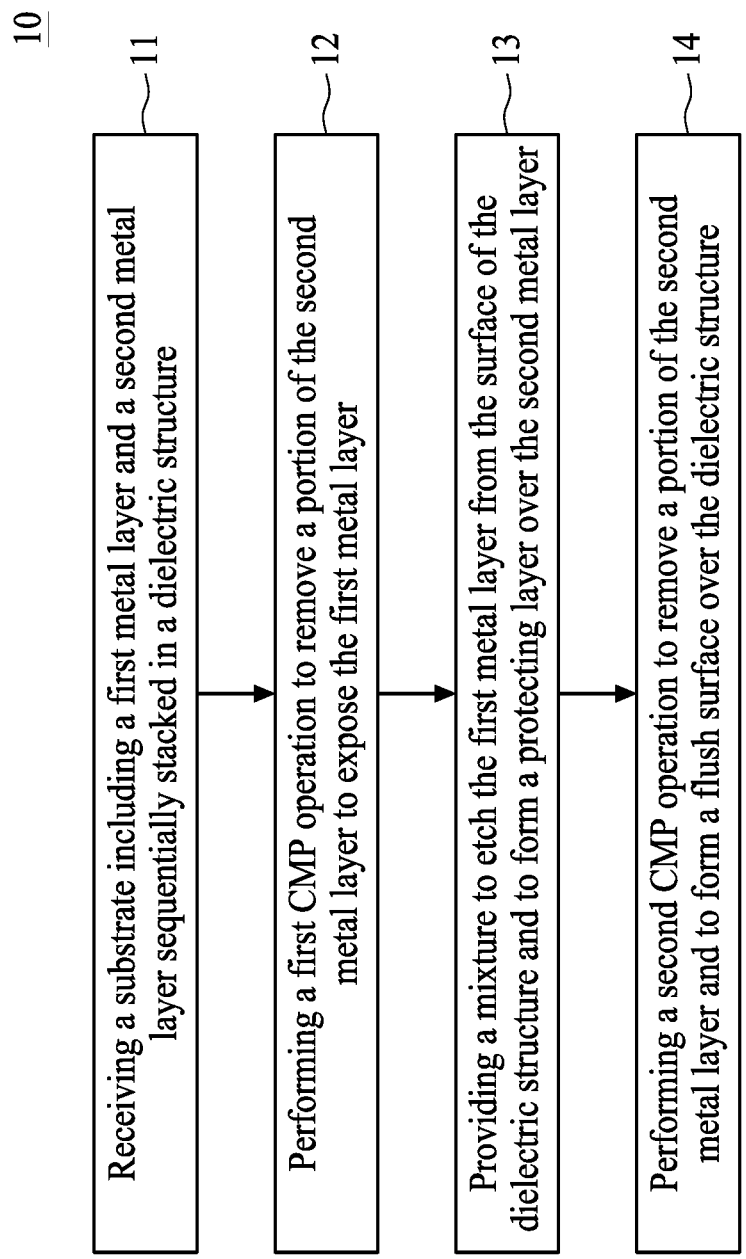
FIG. 1 is a flowchart representing a method for CMP according to aspects of the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper," "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 100 degrees or at other orientations) and the spatially relative descriptors used herein may likewise be interpreted accordingly.

As used herein, the terms such as "first," "second" and "third" describe various elements, components, regions, layers and/or sections, but these elements, components, regions, layers and/or sections should not be limited by these terms. These terms may be only used to distinguish one element, component, region, layer or section from another. The terms such as "first," "second" and "third" when used herein do not imply a sequence or order unless clearly indicated by the context.

As used herein, the term "hybrid" refers to a multi-material system (e.g., a system formed from two or more materials). As used herein, the term "hybrid metal structure" refers to a structure including two or more metal layers stacked and disposed on one another.

Interconnect structures includes layers of metallization lines and layers of dielectric materials. The metallization lines are used to connect various components of semiconductor integrated circuits (ICs). The metallization lines are disposed in dielectric materials, which electrically isolate the metallization lines from each other in shared or adjacent layers of the interconnect structures. In some comparative approaches, trenches and/or vias are formed in one or more layers of dielectric material, wherein the trenches and/or vias are filled with a conductive material, such as copper (Cu), aluminum (Al), alloys, tungsten (W), silver (Ag), doped polysilicon, combinations thereof, and/or the like, to create the metallization lines in the layers and to create vertical conductive vias between adjacent layers.

As the features of these devices are reduced to smaller sizes, the performance of the materials that constitute the device will critically determine their success. One specific area in need of advancement is the size of conducting interconnects composed of materials with greater conductivity and greater mechanical integrity, which presently favors the use of copper, which has twice the conductivity of aluminum and three times the conductivity of tungsten, as the material of choice. Further, a liner that improves copper gap-filling can be used in the interconnect structure. Consequently, gap-fill results of the conductive layer (i.e., the copper layer) that serves as the main electrical connection path can be improved. In some embodiments, the liner can include noble metals such as rhenium (Re), rhodium (Rh) and ruthenium (Ru).

In some comparative approaches, after filling the trenches/vias with copper, a planarization is used to remove superfluous metals, such as the superfluous conductive layer and liner, and a CMP is a commonly-used planarization technique for the removal of the superfluous metals. As mentioned above, the relative movement of the polishing pad and the wafer surface coupled with the reactive chemicals in the abrasive slurry allows CMP to remove the superfluous metals by means of both physical and chemical actions. However, it is found that during the removal of the superfluous metals, noble metals are not easily removed due to their inertness and mechanical hardness. In such comparative approaches, superfluous conductive layer (i.e., a copper layer) may be removed while the superfluous liner remains on the dielectric material. Thus the interconnect structure suffers from short circuit and failure. To remove the superfluous liner, a strong oxidant, such as slurry including orthoperiodic acid ($H_5IO_6$), may be used in the CMP operation. In such comparative approaches, the superfluous liner may be removed, but heavy damage to the copper layer occurs due to galvanic corrosion. Thus the interconnect structure suffers from open circuit and failure. In general, it is difficult to remove a liner that includes a noble metal from a metal structure without damaging other metal layers.

The present disclosure therefore provides methods for CMP and a method for forming an interconnect structure. In some embodiments, a first composition is used to remove the liner including noble metals while a second composition is used to protect other metal layers. Accordingly, the liner can be removed while the other metal layers are protected. In some embodiments, the operation for removing the liner can be performed before the removal of the superfluous conductive layer, such that the short-circuit issue due to the remaining liner can be mitigated. In some embodiments, the method includes performing a first CMP operation to remove a portion of conductive layer until the liner is exposed, performing a removal operation to remove the liner while the conductive layer is protected, and performing a second CMP operation to remove the superfluous conductive layer. In some embodiments, the methods for CMP can be integrated into a method for forming an interconnect structure. Accordingly, the superfluous liner and conductive layer can be separately removed, and the short-circuit issue and the open-circuit issue can both be mitigated.

Figure 2:
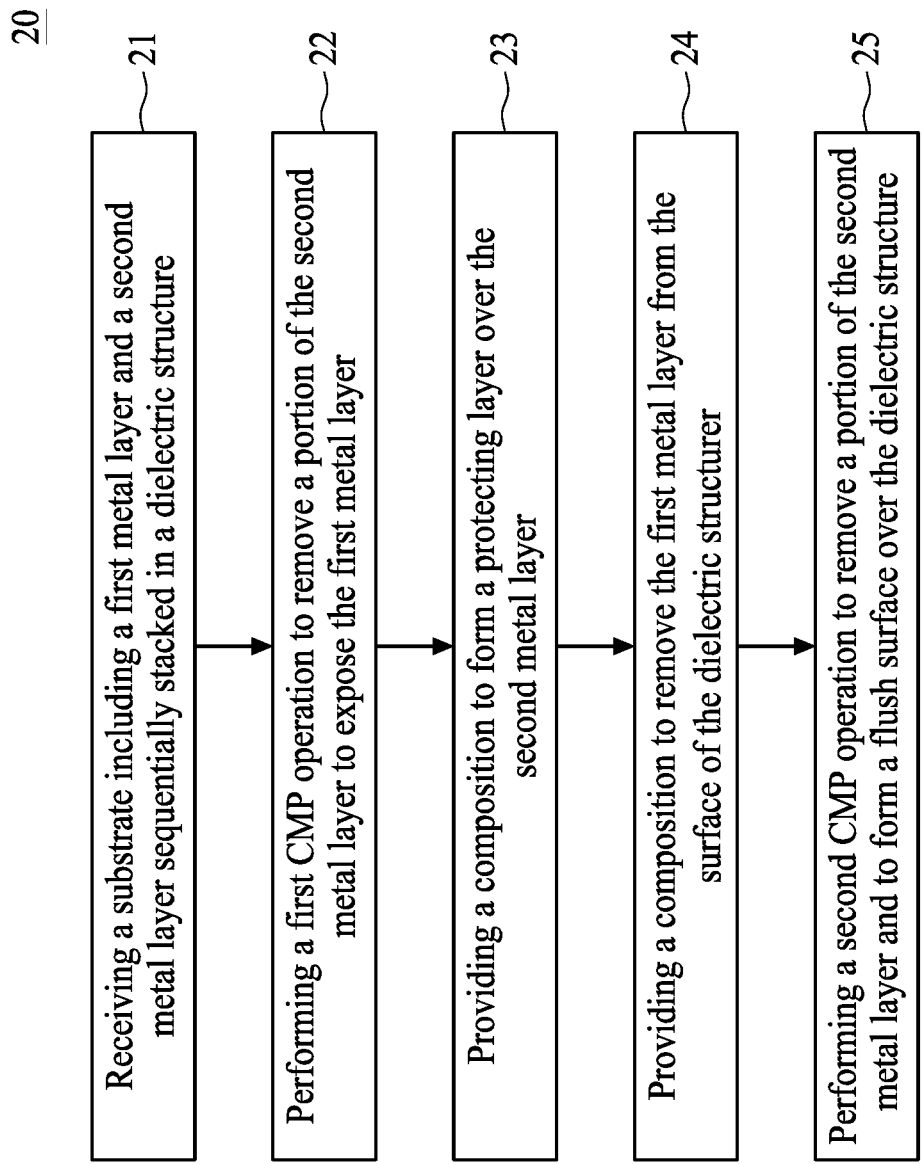
FIG. 2 is a flowchart representing a method for CMP according to aspects of the present disclosure.
Figure 3:
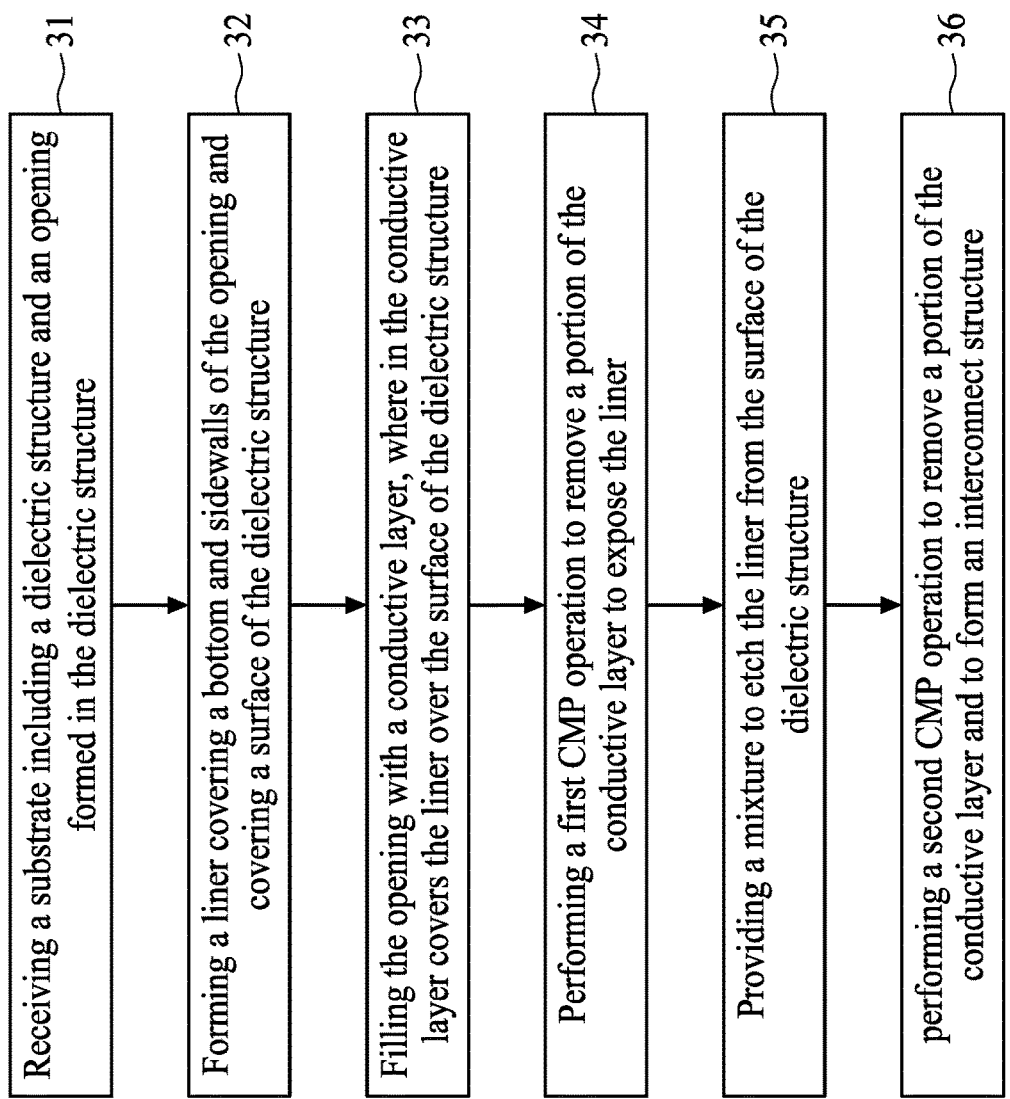
FIG. 3 is a flowchart representing a method for forming an interconnect structure according to aspects of the present disclosure.

FIG. 1 is a flowchart representing a method for CMP 10 according to aspects of the present disclosure, and FIG. 2 is a flowchart representing a method for CMP 20 according to different aspects of the present disclosure. In some embodiments, the methods for CMP 10 and 20 can be integrated into a method for forming an interconnect structure. FIG. 3 is a flowchart representing a method for forming the interconnect structure 30 according to aspects of the present disclosure.

In some embodiments, the method for CMP 10 includes a number of operations (11, 12, 13 and 14), and the method for CMP 20 includes a number of operations (21, 22, 23, 24 and 25). The methods for CMP 10 and 20 will be further described according to one or more embodiments. It should be noted that the operations of the methods for the CMP 10 and 20 may be rearranged or otherwise modified within the scope of the various aspects. It should further be noted that additional processes may be provided before, during, and after the methods 10 and 20, and that some other processes may only be briefly described herein.

In some embodiments, the method for forming the interconnect structure 30 includes a number of operations (31, 32, 33, 34, 35 and 36). The method for forming the interconnect structure 30 will be further described according to one or more embodiments. It should be noted that the operation of the method for forming the interconnect structure 30 may be rearranged or otherwise modified within the scope of the scope of the various aspects. It should further be noted that additional processes may be provided before, during and after the method 30, and that some other processes may only be briefly described herein.

Figure 4A:
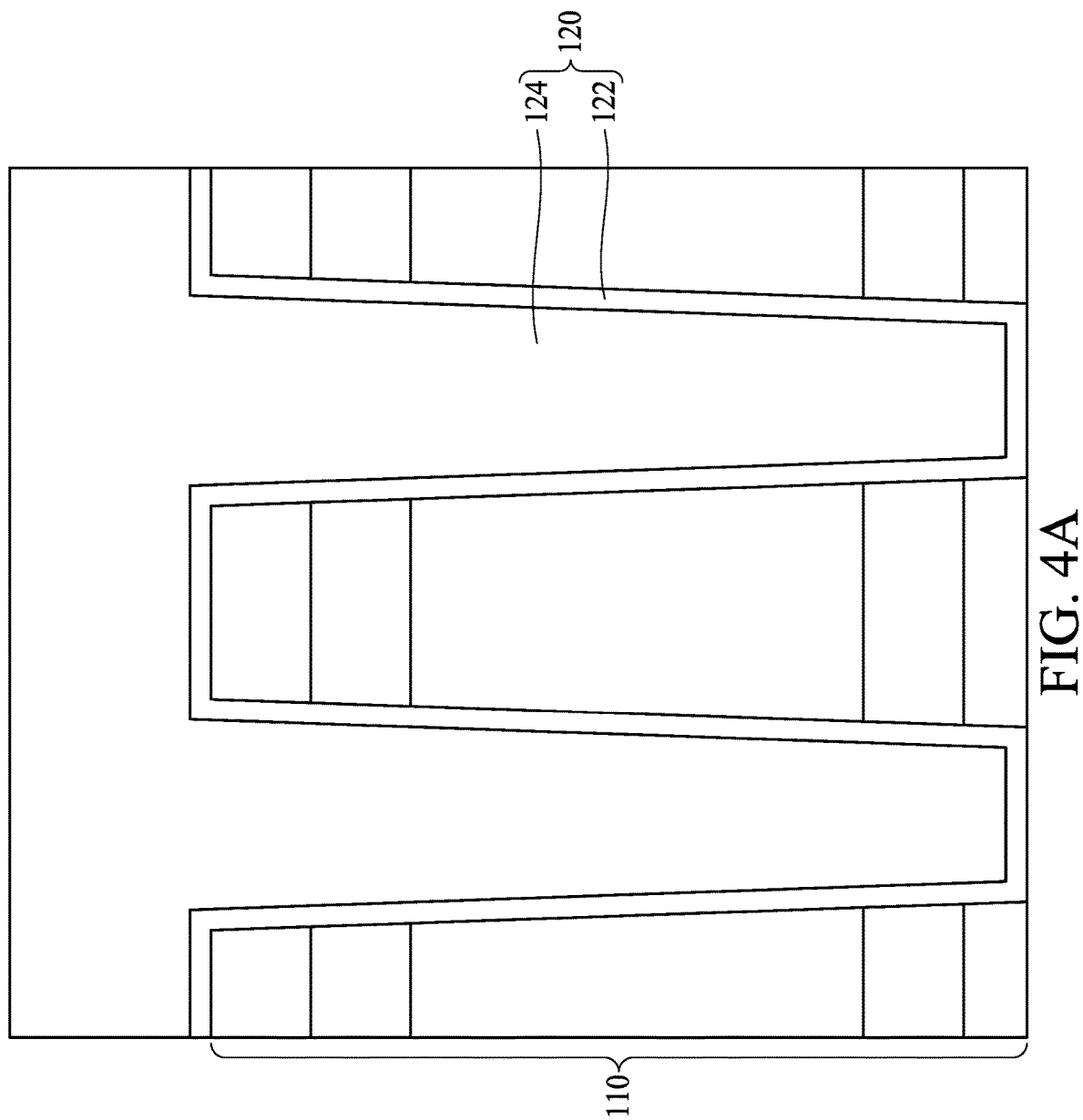
FIGS. 4A-4G are schematic drawings illustrating various stages in a method for CMP according to aspects of one or more embodiments of the present disclosure.

FIGS. 4A to 4G are schematic drawings illustrating various stages in a method for CMP according to aspects of one or more embodiments of the present disclosure. In operation 11, a substrate (not shown) is received. As shown in FIG. 4A, the substrate may include a dielectric structure 110 disposed thereon. In some embodiments, the dielectric structure 110 may include a single layer. In some alternative embodiments, the dielectric structure 110 may include a multi-layered structure including a plurality of dielectric layers. A metal layer stack 120 may be disposed in and on the dielectric structure 110. In some embodiments, the metal layer stack 120 includes at least a first metal layer 122 and a second metal layer 124 sequentially stacked in the dielectric structure 110. As shown in FIG. 4A, the first metal layer 122 may cover a top surface of the dielectric structure 110. In some embodiments, when a trench and/or a via is formed in the dielectric structure 110, the first metal layer 122 may cover sidewalls of the trench and/or a via, but the disclosure is not limited thereto. In some embodiments, the second metal layer 124 can be disposed on the first metal layer 122. Further, the second metal layer 124 may cover a surface of the first metal layer 122 entirely, as shown in FIG. 4A. In some embodiments, when a trench and/or a via is formed in the dielectric structure 110, the trench and/or the via can be filled with the second metal layer 124, but the disclosure is not limited thereto. Additionally, other metal layers may be disposed between the first metal layer 122 and the second metal layer 124, though not shown.

The first metal layer 122 and the second metal layer 124 include different metals. In some embodiments, the first metal layer 122 may include noble metals such as rhenium (Re), rhodium (Rh) and ruthenium (Ru), but the disclosure is not limited thereto. The second metal layer 124 may include metal of high electric conductivity. For example, the second metal layer 124 may include copper (Cu), aluminum (Al), tungsten (W), silver (Ag), or alloys thereof, but the disclosure is not limited thereto. In some embodiments, a thickness of the second metal layer 124 is greater than a thickness of the first metal layer 122, but the disclosure is not limited thereto. Accordingly, the metal layer stack 120 including at least two different metal materials can be referred to as a hybrid metal structure. In some embodiments, the first metal layer 122 and the second metal layer 124 are exposed through the surface of the dielectric structure 110. Further, a top surface of the second metal layer 124 may be exposed to a surrounding environment, but the disclosure is not limited thereto.

Figure 4B:
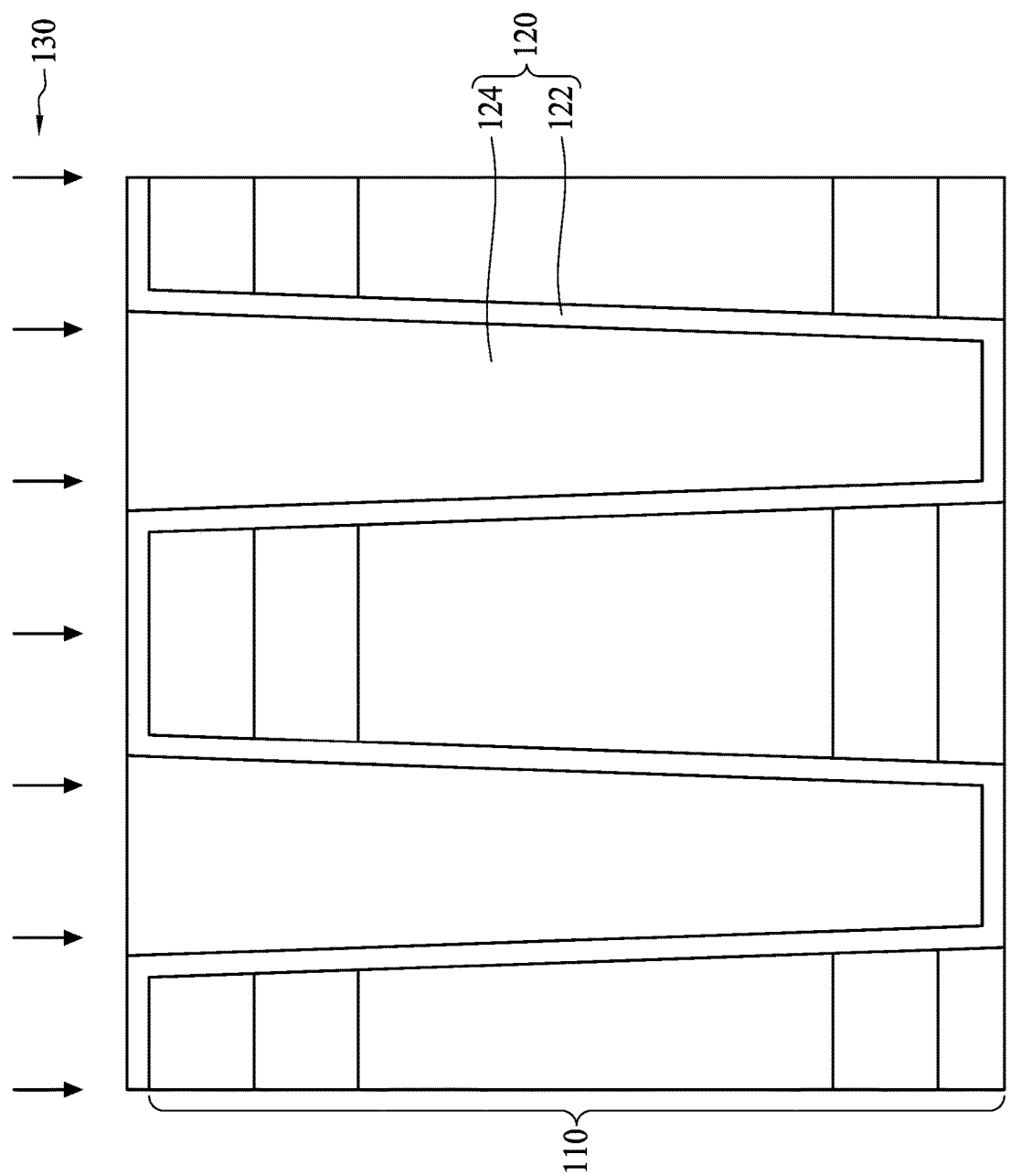

As shown in FIG. 4B, in operation 12, a first CMP operation 130 is performed to remove a portion of the second metal layer 124 and expose the first metal layer 122. As shown in FIG. 4B, the first CMP operation 130 can be performed remove one or more metal layers from the first metal layer 122, until the surface of the first metal layer 122 is exposed. In some embodiments, the first metal layer 122 has a surface exposed to the surrounding environment after the first CMP operation 130, and a ratio of the surface area of the first metal layer 122 to the surface area of the dielectric structure 110 is greater than approximately 5%. In some embodiments, the ratio of the surface area of the first metal layer 122 to the surface area of the dielectric structure 110 is greater than approximately 10%.

In some embodiments, when the first metal layer 122 is not covered by the second metal layer 124, operation 12 can be omitted.

Figure 4C:
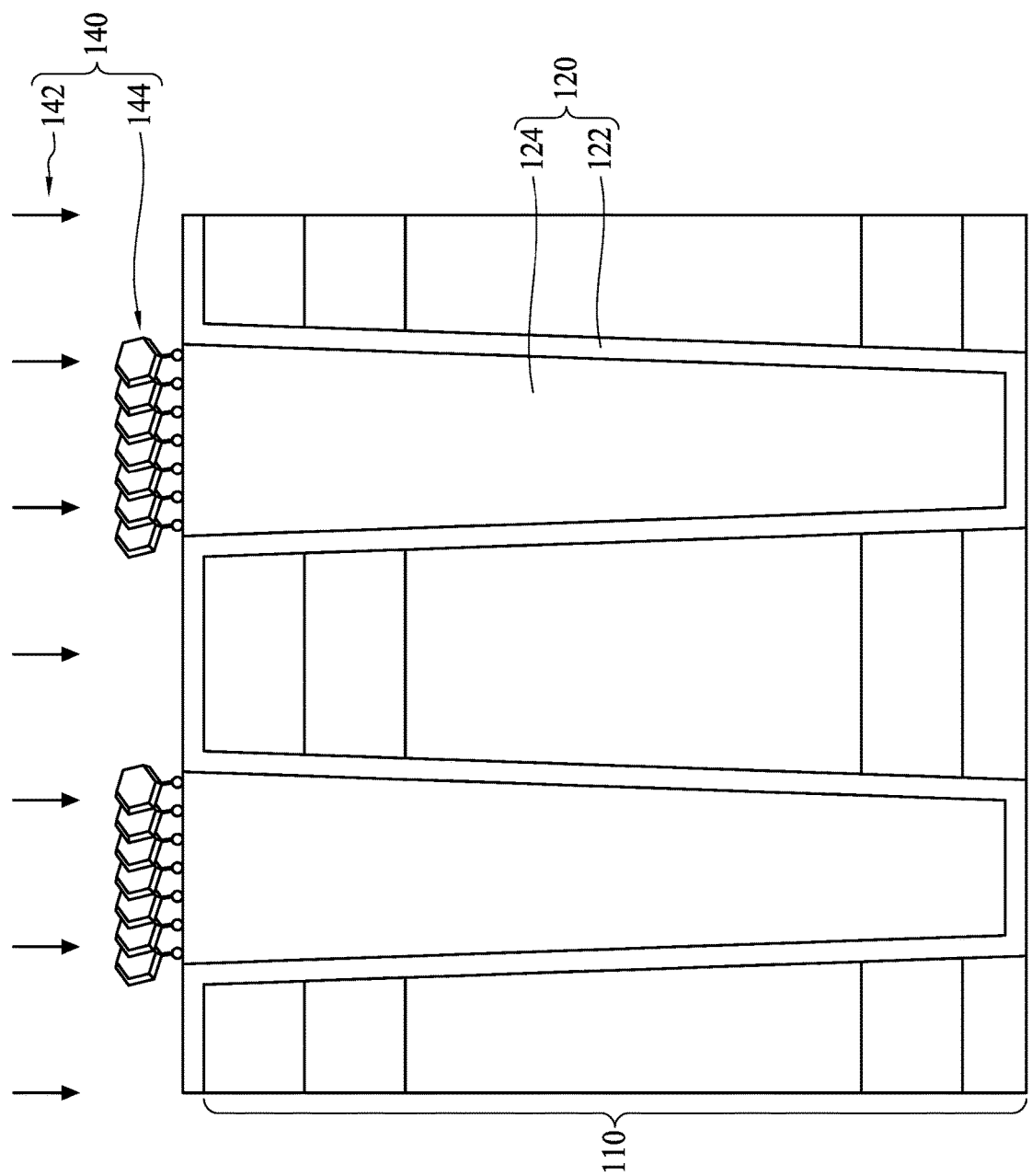
Figure 4D:
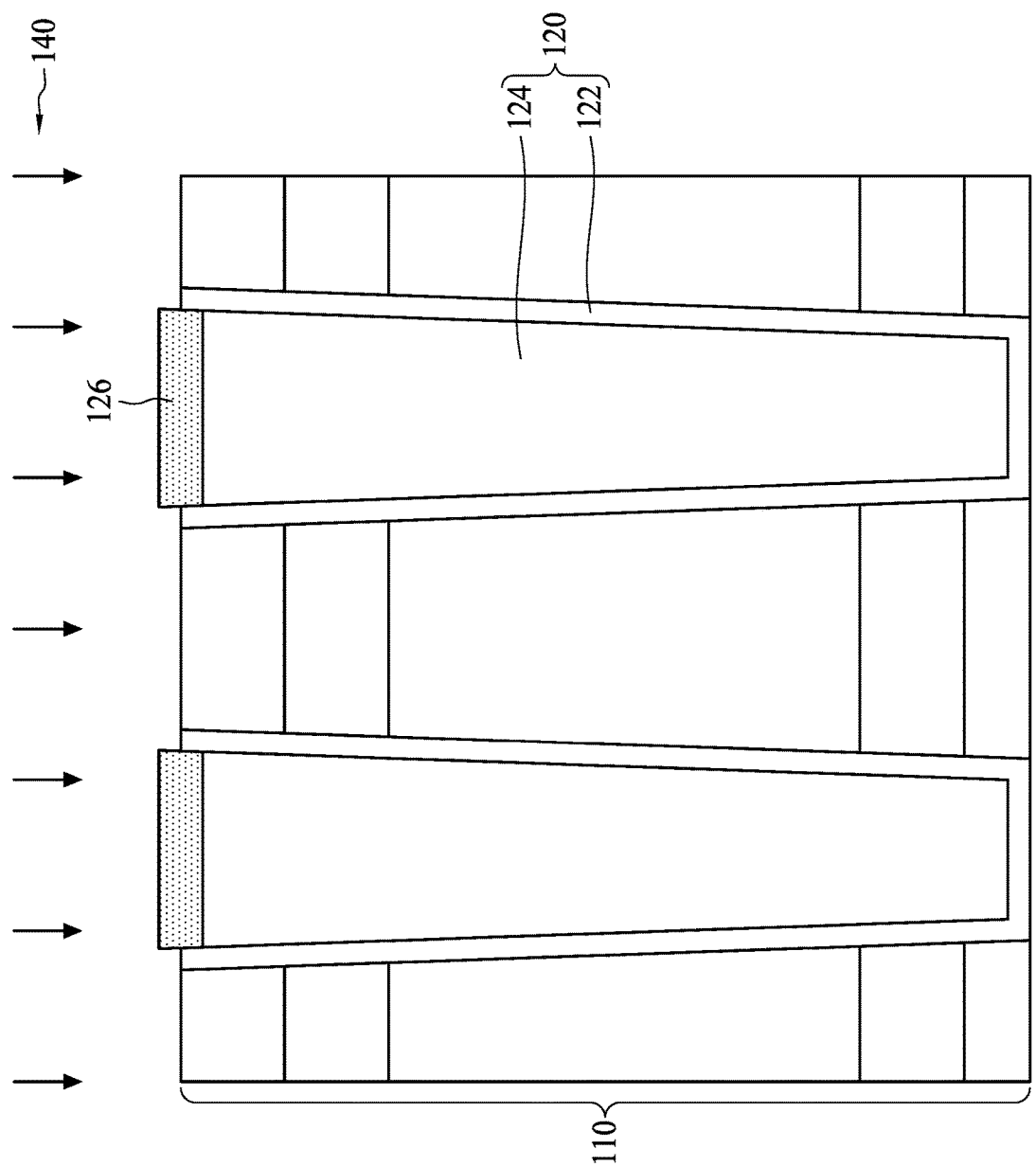

As shown in FIGS. 4C and 4D. In operation 13, a mixture 140 is provided to the first metal layer 122, the second metal layer 124 and the dielectric structure 110. In some embodiments, the mixture 140 includes at least a first composition 142 and a second composition 144. In some embodiments, an etching rate of the first composition 142 on the first metal layer 122 is greater than approximately 5 Å/min, but the disclosure is not limited thereto. The first composition 142 includes a strong oxidant. In some embodiments, the first composition 142 includes halogen oxoacid and/or its salt. For example, the first composition 142 can include periodic acid ($H_5IO_6$) or periodate, perbromic acid ($HBrO_4$) or perbromate, perchloric acid ($HClO_4$) or perchlorate, or chlorite and chlorate, bromite and bromate, but the disclosure is not limited thereto. In some embodiments, the first composition 142 is between approximately 100 parts per million (ppm) and approximately 20,000 ppm. In some embodiments, the second composition 144 includes benzotriazole (BTA), triazole derivatives, thioazole derivatives, or tetrazole derivatives. In some embodiments, the second composition 144 is between approximately 1 ppm and approximately 100,000 ppm. In some embodiments, a pH of the mixture 140 is between approximately 5.0 and approximately 14.0. In some embodiments, a temperature of the mixture 140 is between approximately 0° C. and approximately 80° C., but the disclosure is not limited thereto.

Referring to FIG. 4D, in operation 13, the mixture 140 is provided to form a protecting layer 126 over the surface of the second metal layer 124 and to remove a portion of the first metal layer 122, such that the surface of the dielectric structure 110 is exposed. In some embodiments, the mixture 140 can include at least a first composition 142 and a second composition 144. Further, the first composition 142 is provided to remove the portion of the first metal layer 122 from the surface of the dielectric structure 110, and the second composition 144 is provided to form the protecting layer 126 over the second metal layer 124. It should be noted that in operation 13, the second composition 144 is likely to react with the second metal layer 124 and thus the protecting layer 126 can be formed over the surface of the second metal layer 124. For example, when the second metal layer 124 includes copper, the second composition 144 such as BTA can form covalent bonds and dipolar bonds with the copper atoms. Thus, the protecting layer 126 is formed on the copper surface and the protecting layer 126 is able to protect the underlying copper atoms from further chemical reaction, while the top surface of the first metal layer 122 is free of the protecting layer 126. Meanwhile, the first composition 142, because it is a strong oxidant, is able to oxidize the noble metals. Accordingly, noble metal oxides are formed and are easily removed from the surface of the dielectric structure 110. However, during the removal of the first metal layer 122, the second metal layer 124 is protected from the chemical reaction by the protecting layer 126.

In some embodiments, a process duration of operation 13 is between approximately 15 seconds and approximately 15 minutes. In some comparative approaches, when the process period of operation 13 is less than approximately 15 seconds, the first metal layer 122 may remain on the surface of the dielectric structure 110, and thus subsequent operations may be impeded by the first metal layer 122 due to its inertness and mechanical hardness. In some comparative approaches, when the process duration of operation 13 is greater than approximately 10 minutes, the protecting layer 126 may be consumed and thus the second metal layer 124, which should to be protected from the first composition 142, is damaged. In some embodiments, an overall etching rate for the operation 13 towards the metal layer 122 lies in a range of approximately 5 Å/min to approximately 50 Å/min, but the disclosure is not limited thereto.

Figure 4E:
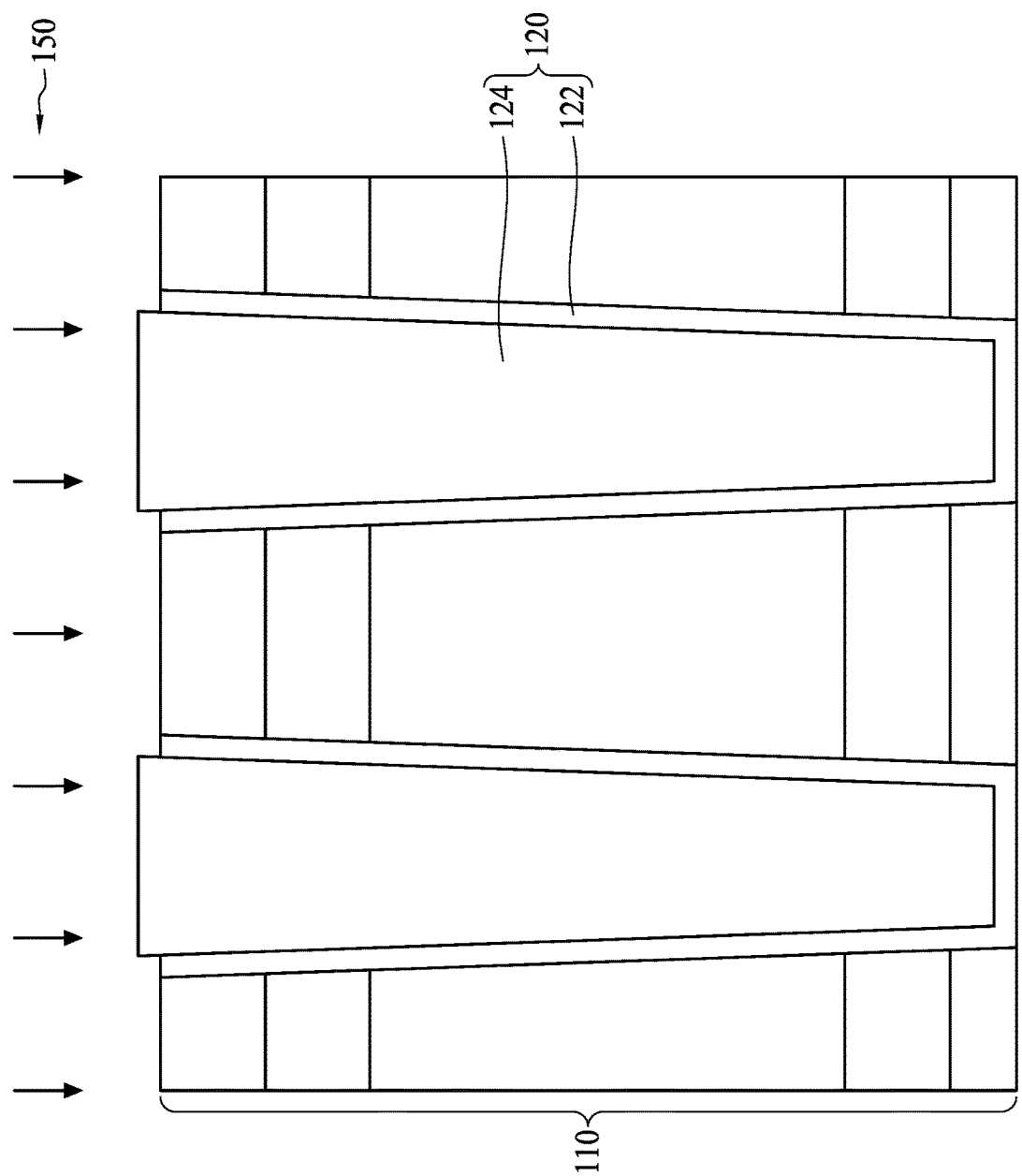

Referring to FIG. 4E, in some embodiments, a cleaning operation 150 can be performed to remove the mixture 140, the protecting layer 126 and other residue from the substrate. Accordingly, the second metal layer 124 can be exposed, as shown in FIG. 4E.

Figure 4F:
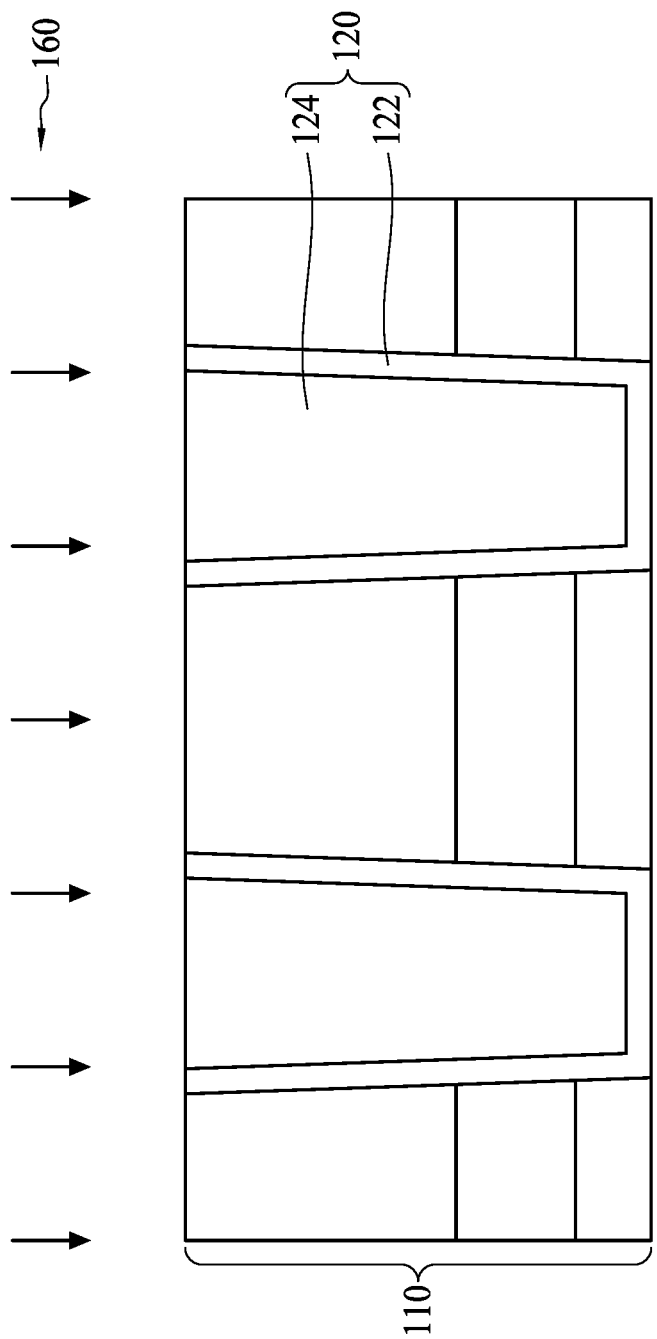
Figure 4G:
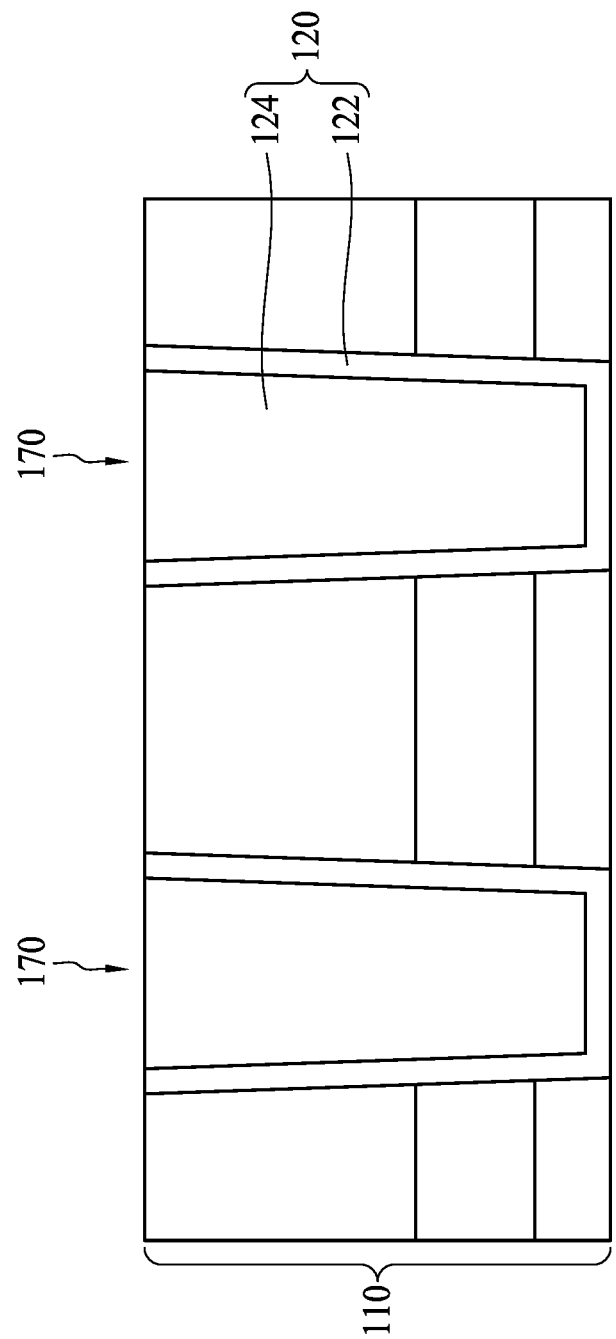

Referring to FIGS. 4F and 4G, in operation 14, a second CMP operation 160 is performed to remove a portion of the second metal layer 124, and to form a flush surface over the dielectric structure 110 and the second metal layer 124.

As mentioned above, the first metal layer 122 including the noble metals may be unable to be removed by Cu-CMP due to its chemical inertness and mechanical hardness. According to the method for CMP 10, the mixture 140 including the first composition 142 and the second composition 144 is provided. The first composition 142 is able to remove the first metal layer 122 from the surface of the dielectric structure 110 while the second composition 144 is able to react with the second metal layer 124 to form the protecting layer 126 over the second metal layer 124. Consequently, the second metal layer under the protecting layer 126 can be protected during the removal of the first metal layer 122. The second metal layer 124 can then be removed by the CMP operation 160. Accordingly, a hybrid metal structure 170 (shown in FIG. 4G) having a surface flush with the surface of the dielectric structure 110 is obtained. Further, the issue of noble metal residue over the substrate can be mitigated.

FIGS. 5A to 5E are schematic drawings illustrating various stages in a method for CMP according to aspects of one or more embodiments of the present disclosure. It should be understood that same elements in FIGS. 5A to 5E and FIGS. 4A to 4G are depicted by same numerals and can include a same material, and repetitive details may be omitted in the interest of brevity.

In operation 21, a substrate (not shown) is received. The substrate may include a dielectric structure 110 disposed thereon, and a metal layer stack 120 may be disposed in the dielectric structure 110. In some embodiments, the metal layer stack 120 includes at least a first metal layer 122 and a second metal layer 124 sequentially stacked in the dielectric structure 110. The first metal layer 122 and the second metal layer 124 include different metals; therefore, the metal layer stack 120 including at least two different metal materials can be referred to as a hybrid structure. In some embodiments, the first metal layer 122 and the second metal layer 124 are exposed through the surface of the dielectric structure 110. Further, a top surface of the second metal layer 124 may be exposed to an surrounding environment, but the disclosure is not limited thereto.

Figure 5A:
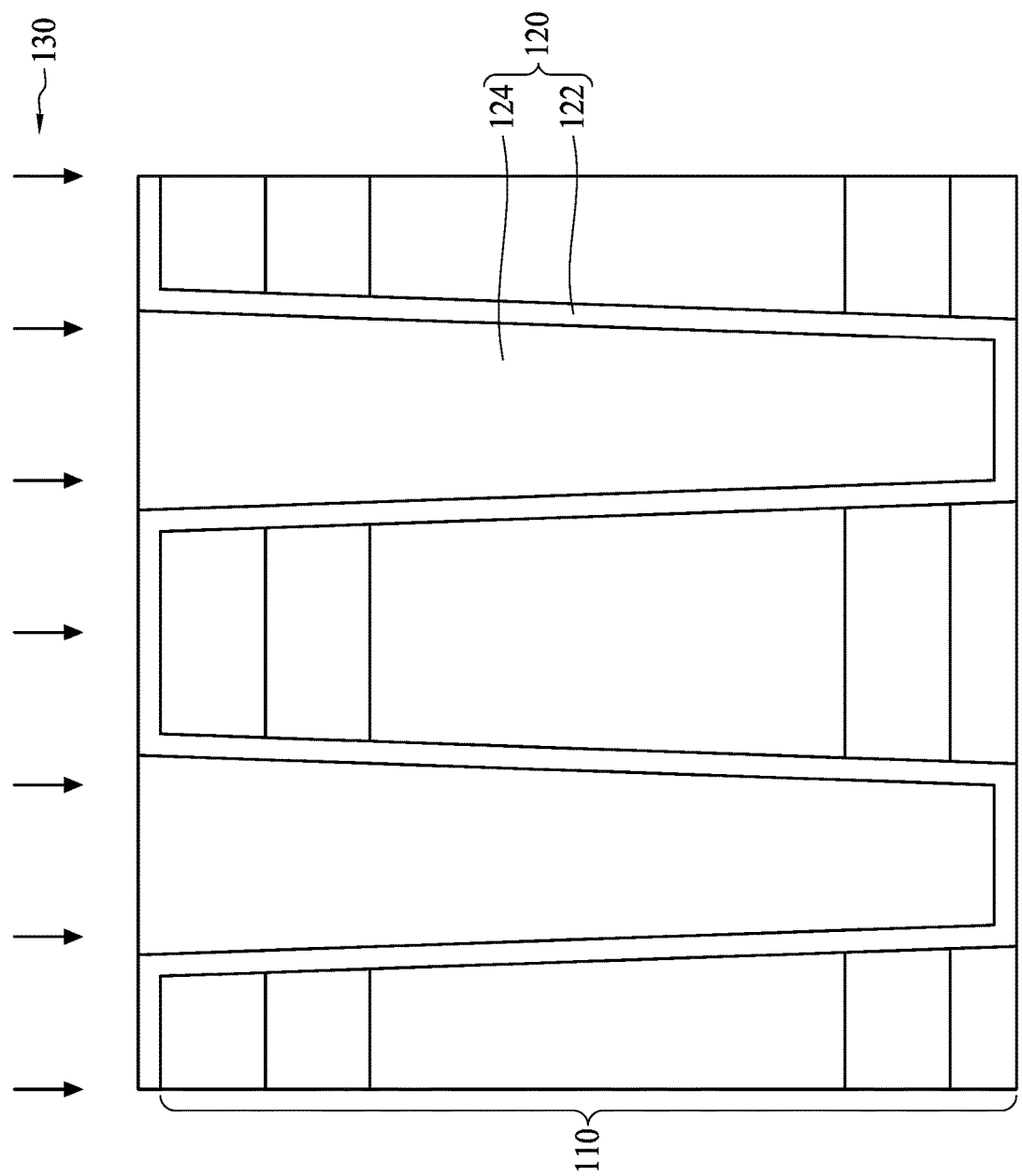
FIGS. 5A-5E are schematic drawings illustrating various stages in a method for CMP according to aspects of one or more embodiments of the present disclosure.

Referring to FIG. 5A, in operation 22, a first CMP operation 130 is performed to remove a portion of the second metal layer 124 to expose the first metal layer 122. As shown in FIG. 5A, the first CMP operation 130 can be performed to remove the metals over the first metal layer 122, until the surface of the first metal layer 122 is exposed. In some embodiments, the first metal layer 122 has a surface exposed to the surrounding environment after the first CMP operation 130, and a ratio of the surface area of the first metal layer 122 to the surface area of the dielectric structure 110 is greater than approximately 5%. In some embodiments, the ratio of the surface area of the first metal layer 122 to the surface area of the dielectric structure 110 is greater than approximately 10%.

Figure 5B:
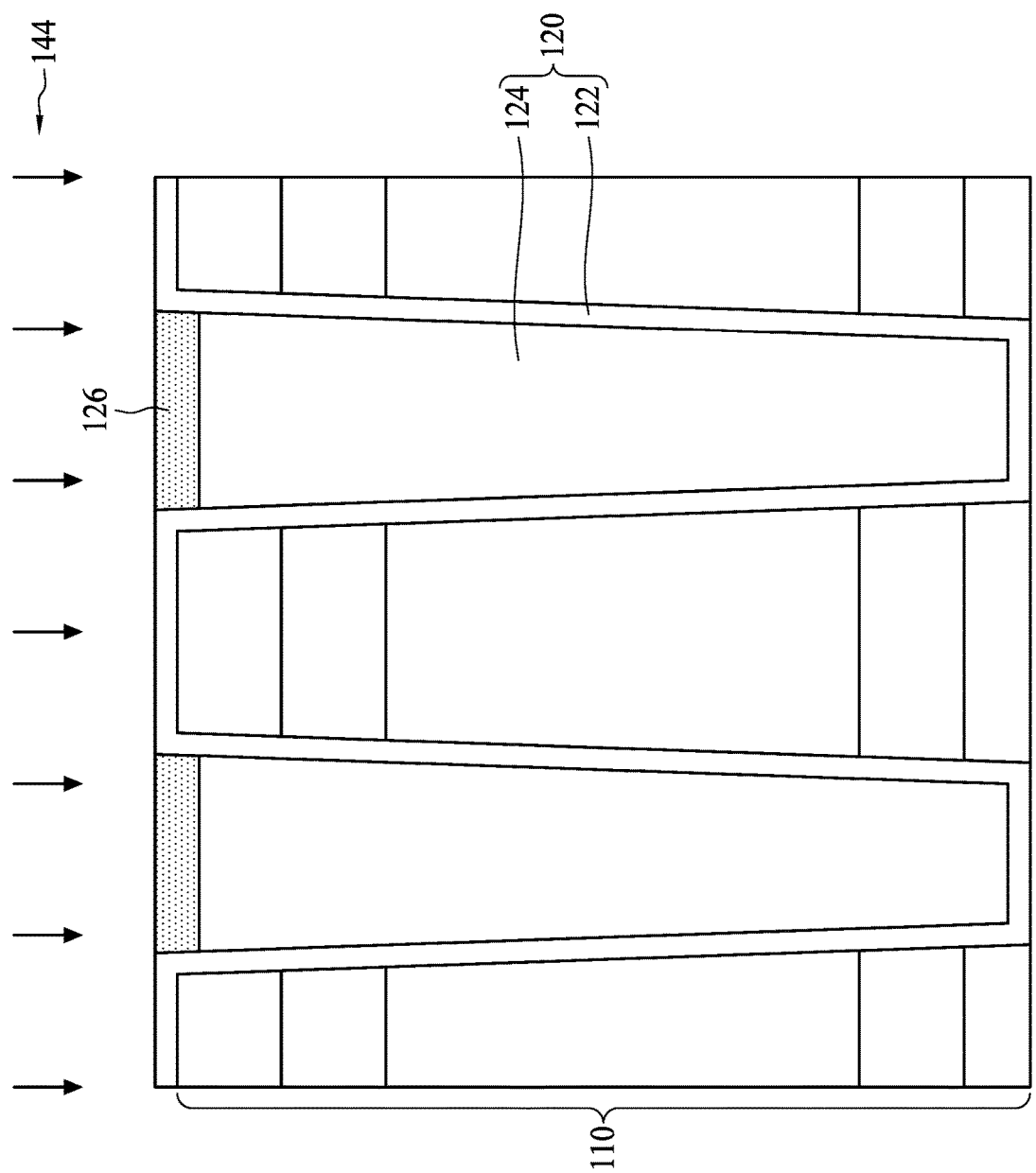

Referring to FIG. 5B, in operation 23, a composition 144 is applied to the first metal layer 122, the second metal layer 124 and the dielectric structure 110. In some embodiments, the second composition 144 includes benzotriazole (BTA), other triazole derivatives, thioazole derivatives, and tetrazole derivatives. The composition 144 is provided to form a protecting layer 126 over the second metal layer 124. It should be noted that in operation 23, the composition 144 is likely to react with the second metal layer 124. For example, when the second metal layer 124 includes copper, the composition 134 such as BTA can form covalent bonds and dipolar bonds with the copper atoms. Thus, the protecting layer 126 is formed on the copper surface and protects the underlying copper from further chemical reaction, while the top surface of the first metal layer 122 is free of the protecting layer 126.

Figure 5C:
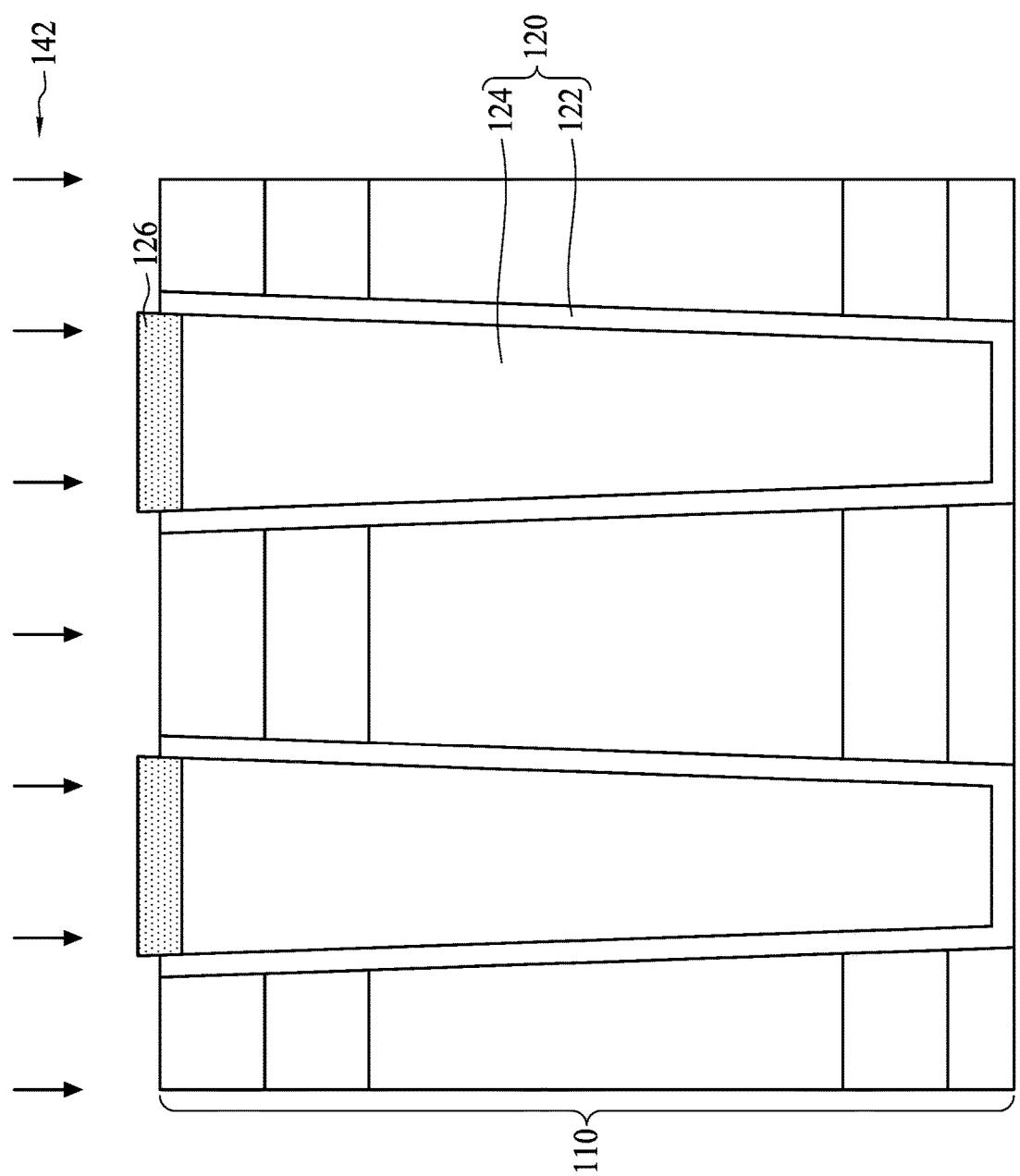

Referring to FIG. 5C, in operation 24, a composition 142 is applied to the first metal layer 122, the second metal layer 124 and the dielectric structure 110. In some embodiments, an etching rate of the composition 142 on the first metal layer 122 is greater than approximately 5 Å/min, but the disclosure is not limited thereto. The composition 142 includes a strong oxidant. In some embodiments, the composition 142 includes halogen oxoacid and/or its salt. For example, the composition 142 can include periodic acid ($H_5IO_6$) or periodate, perbromic acid ($HBrO_4$) or perbormate, perchloric acid ($HClO_4$) or perchlorate, or chlorite and chlorate, bromite and bromate, but the disclosure is not limited thereto. As shown in FIG. 5C, in operation 24, the composition 142 is provided to remove a portion of the first metal layer 122, such that the surface of the dielectric structure 110 is exposed. It should be noted that because the composition 142 is a strong oxidant, noble metal oxides are formed from the first metal layer 122, wherein the noble metal oxides are easily removed from the surface of the dielectric structure 110. Further, during the removal of the first metal layer 122, the second metal layer 124 is protected from the chemical reactions by the protecting layer 126.

In some embodiments, a process duration of operation 24 is between approximately 15 seconds and approximately 10 minutes. In some comparative approaches, when the process duration of operation 24 is less than approximately 15 seconds, the first metal layer 122 may remain on the surface of the dielectric structure 110, and thus subsequent operations may be impeded by the first metal layer 122 due to its inertness and mechanical hardness. In some comparative approaches, when the process duration of operation 24 is greater than approximately 10 minutes, the protecting layer 126 may be consumed and thus the second metal layer 124, which should be protected from the composition 142, is damaged.

Figure 5D:
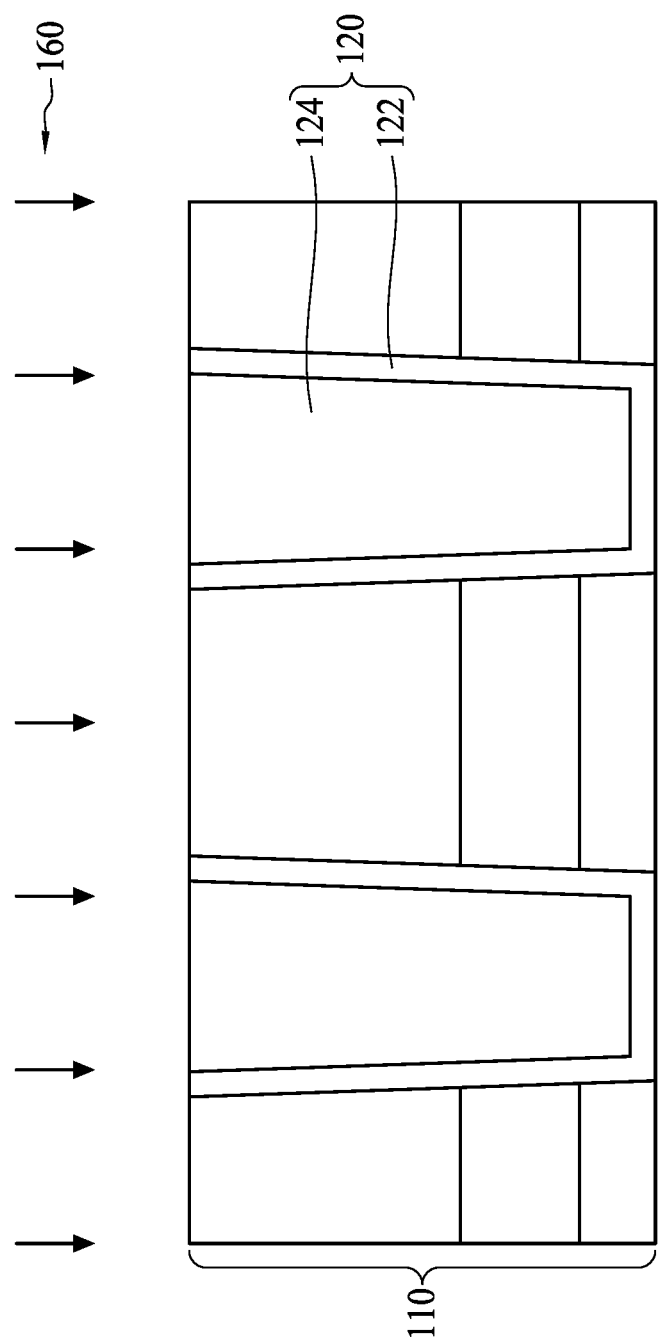
Figure 5E:
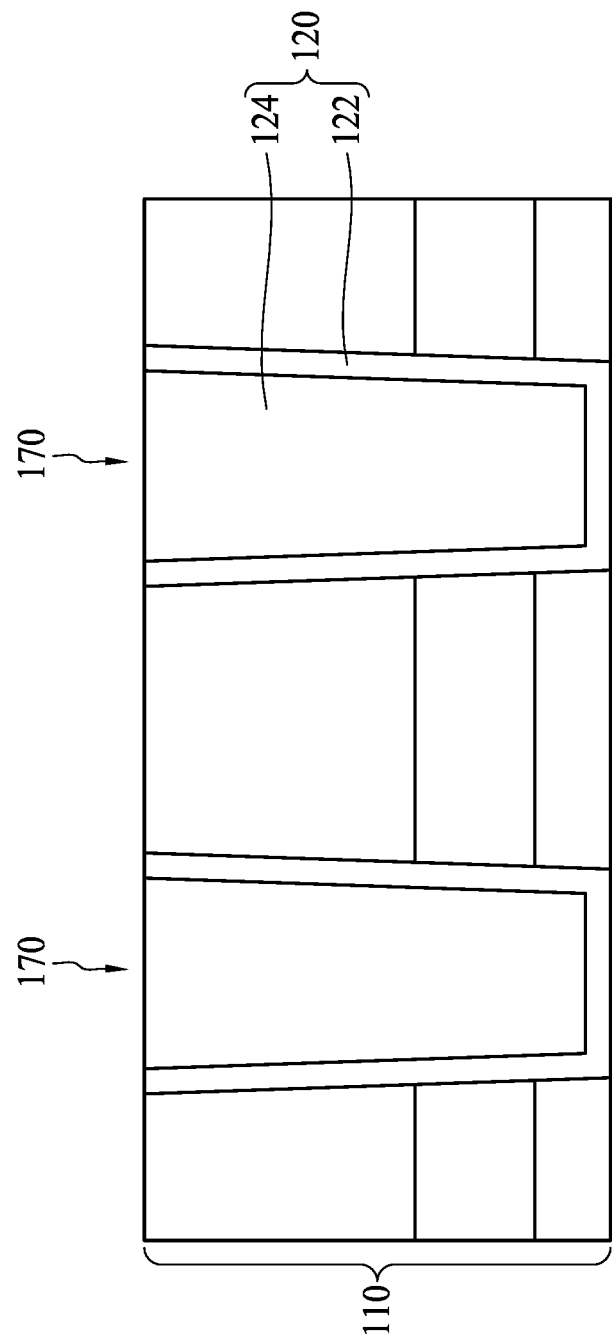

Referring to FIGS. 5D and 5E, in some embodiments, a cleaning operation (not shown) can be performed to remove the composition 142, the protecting layer 126 and other residue from the substrate. In operation 25, a second CMP operation 160 is performed to remove a portion of the second metal layer 124, and to form a flush surface over the dielectric structure 110.

As mentioned above, the first metal layer 122 including the noble metals may be unable to be removed by Cu-CMP due to the first metal layer's chemical inertness and mechanical hardness. According to the method for CMP 20, in operation 23, the protecting layer 126, which serves to protect the second metal layer 124, is formed by applying the composition 144 to the second metal layer 124. Therefore, in operation 24, the first metal layer 122 can be removed from the surface of the dielectric structure 110, while the second metal layer 124 can be protected by the protecting layer 126. The second metal layer 124 can then be removed by the second CMP operation 160 in operation 25. Accordingly, a hybrid metal structure 170 (shown in FIG. 5E) having a surface flush with the surface of the dielectric structure 110 can be obtained. Further, the issue of noble metal residue over the substrate can be mitigated.

In some embodiments, the methods for CMP 10 and 20 can be integrated in a method for forming an interconnect structure. In some embodiments, the interconnect structure can be a part of a back-end of line (BEOL) interconnect structure. In the interest of brevity, the following description provides a method for forming an interconnect structure 30 integrated with the method for CMP 10. However, those skilled in the art should understand that the method for forming the interconnect structure 30 can be integrated with the method for CMP 20, and repeated descriptions thereof are omitted.

Figure 6:
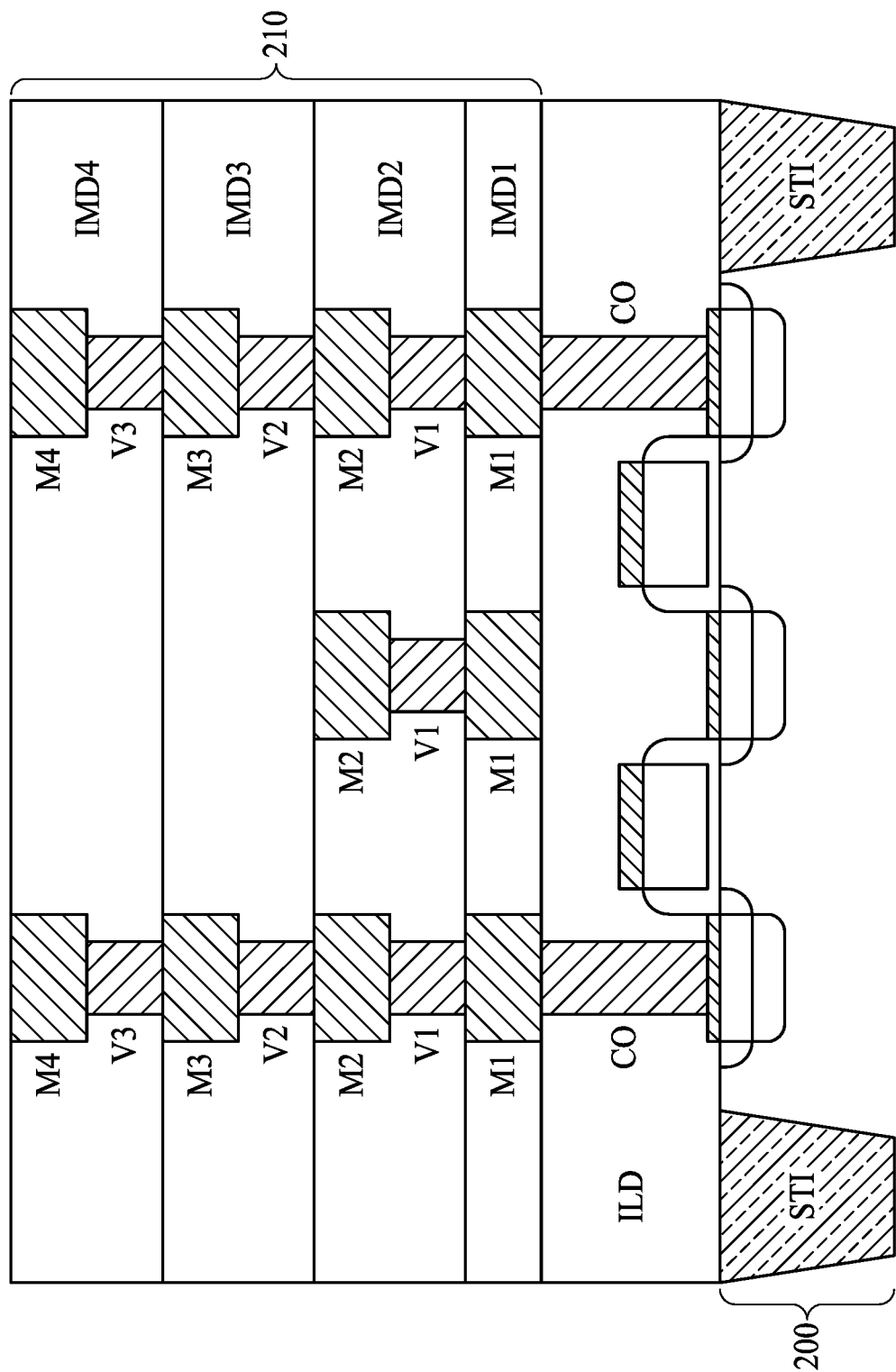
FIG. 6 is a schematic drawing illustrating a BEOL interconnect structure according to aspects of one or more embodiments of the present disclosure.

FIG. 6 is a schematic drawing illustrating a BEOL interconnect structure according to aspects of one or more embodiments of the present disclosure. In some embodiments, a BEOL interconnect structure 210 can be formed by the method for forming the interconnect structure 30. In some embodiments, the BEOL interconnect structure 210 is formed on a substrate 200. The substrate 200 may be a semiconductor substrate formed of commonly-used semiconductor materials such as silicon (Si), silicon germanium (SiGe), gallium arsenide (GaAs), or the like, and may be a bulk substrate or a semiconductor-on-insulator (SOI) substrate. In some embodiments, the substrate 200 can include a plurality of functional regions. The plurality of functional regions can be defined and electrically isolated from each other by isolation structures, such as shallow trench isolations (STIs), but the disclosure is not limited thereto. Various electrical components may be formed over the substrate 200. Examples of the electrical components include active devices, such as transistors and diodes, and passive devices, such as capacitors, inductors, and resistors. As shown in FIG. 6, in some embodiments, active devices, i.e., transistors, can be formed over the substrate 200.

An inter-layer dielectric layer ILD can be formed over the various electrical components, and contact plugs CO are formed in the inter-layer dielectric layer ILD for providing electrical connections between other circuitry/elements. The formation operations of the contact plugs CO can include forming openings in the inter-layer dielectric layer ILD, filling the openings with conductive materials, and performing a planarization such as CMP. In some embodiments, the contact plugs CO can include tungsten (W), but other suitable conductive material such as silver (Ag), aluminum (Al), copper (Cu), AlCu, or the like may also be used.

A BEOL interconnect structure 210 can be formed over the inter-layer dielectric layer ILD and the contact plugs CO. In some embodiments, the BEOL interconnect structure 210 includes a plurality of conductive layers. For example, the BEOL interconnect structure 210 includes a plurality of metal layers labeled M1 through M4 and a plurality of conductors labeled V1 through V3. Further, the metal layers M1 through M4 and the conductors V1 through V3 are disposed in a plurality of inter-metal dielectric layers labeled IMD1 through IMD4. The inter-metal dielectric layers IMD1 through IMD4 may provide electrical insulation as well as structural support for the various features during many fabrication operations. In some embodiments, the method for forming the interconnect structure can also be used to form each of the metal layers M1 through M4 and/or the conductors t V1 through V4 of the BEOL interconnect structure 210.

Figure 7A:
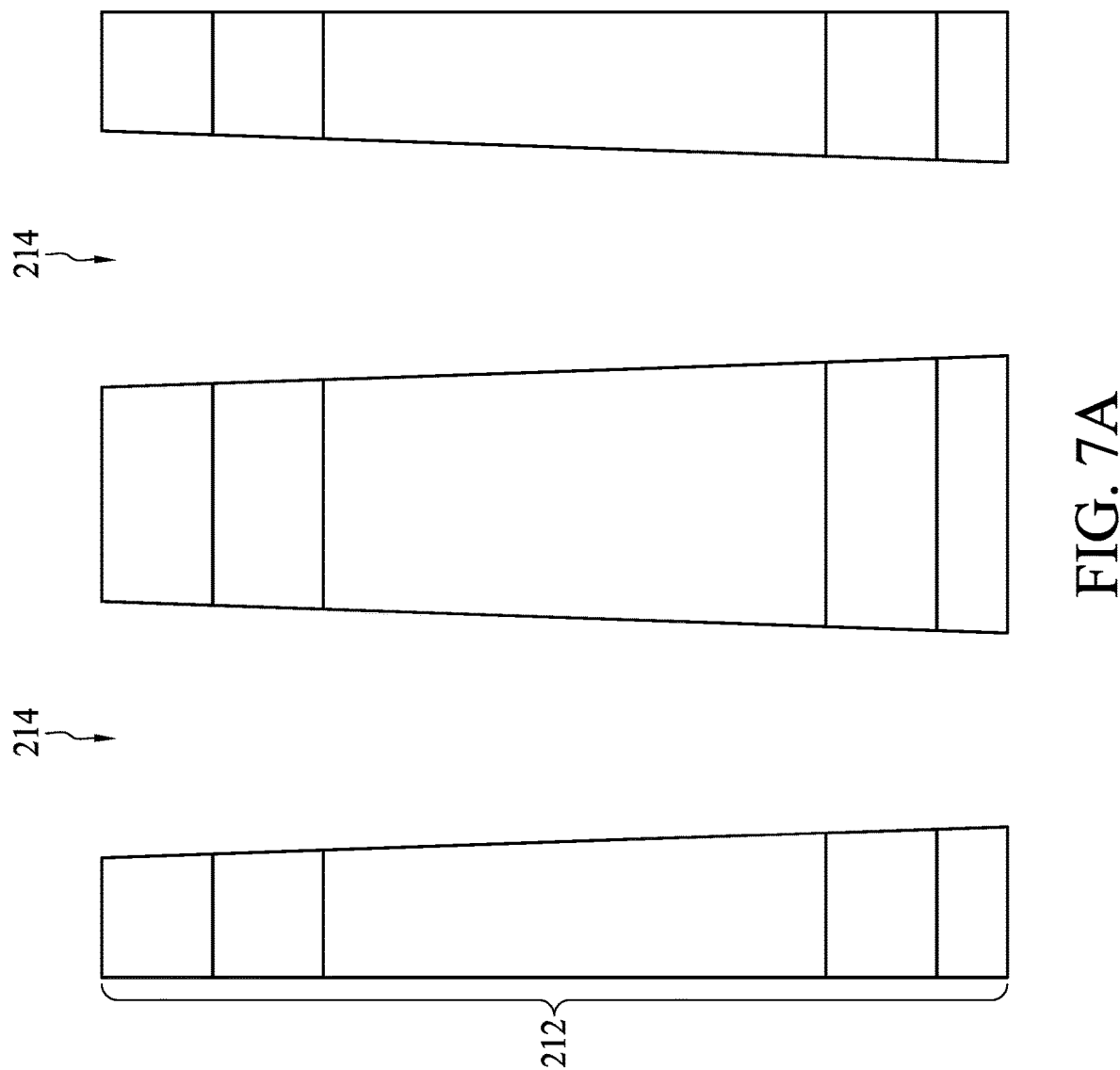
FIGS. 7A-7H are schematic drawings illustrating various stages in a method for forming an interconnect structure according to aspects of one or more embodiments of the present disclosure.

FIGS. 7A to 7H are schematic drawings illustrating various stages in a method for forming an interconnect structure according to aspects of one or more embodiments of the present disclosure. In operation 31, a substrate is received. In some embodiments, the substrate 200 having the inter-layer dielectric layer ILD and the contact plug CO can be received. It should be noted that the substrate 200, the inter-layer dielectric layer ILD and the contact plug CO are omitted from FIG. 7A for clarity. As shown in FIGS. 6 and 7A, the substrate 200 can include a dielectric structure 212 disposed thereon. In some embodiments, the dielectric structure 212 can be comprised of the inter-metal dielectric layers IMD1 through IMD4. As mentioned above, the dielectric structure 212 can be a single-layered structure or a multi-layered structure. In some embodiments, the dielectric structure 212 may be formed of silicon oxide, carbon-doped silicon oxide, a comparatively low dielectric constant (k value) dielectric material with a k value less than about 4.0, or a combination thereof. The dielectric structure 212 may be formed of a low-k dielectric material, an extreme low-k dielectric material, a porous low-k dielectric layer, or a combination thereof. The term "low-k" is intended to define a dielectric constant of a dielectric material of 3.0 or less. The term "extreme low-k" (ELK) means a dielectric constant of 2.5 or less, and preferably between 1.9 and 2.5. The term "porous low-k" refers to a dielectric constant of a dielectric material of 2.0 or less, and preferably 1.5 or less. A wide variety of low-k materials may be employed in accordance with various embodiments, for example, spin-on inorganic dielectrics, spin-on organic dielectrics, porous dielectric materials, organic polymer, organic silica glass, FSG (SiOF series material), HSQ (hydrogen silsesquioxane) series material, MSQ (methyl silsesquioxane) series material, or porous organic series material. The dielectric structure 212 can be deposited through any of a variety of techniques, such as chemical vapor deposition (CVD), physical vapor deposition (PVD), atomic layer deposition (ALD), remote plasma enhanced chemical vapor deposition (RPECVD), liquid source misted chemical deposition (LSMCD), coating, spin coating, or another process that is adapted to form a thin film layer over the substrate. Additionally, a bottom etch stop layer, a middle etch stop layer, a polish stop layer, or an anti-reflective coating (ARC) layer may be optionally deposited on or intermediately in the dielectric structure 212, though not shown.

As shown in FIG. 7A, an opening 214 is formed in the dielectric structure 212. In some embodiments, the opening 214 can be a dual damascene opening including an upper trench section and a lower via-hole section, though not shown. The opening 214 may be formed using a typical lithographic operation with masking technologies and an anisotropic etch operation (e.g., plasma etching or reactive ion etching).

Figure 7B:
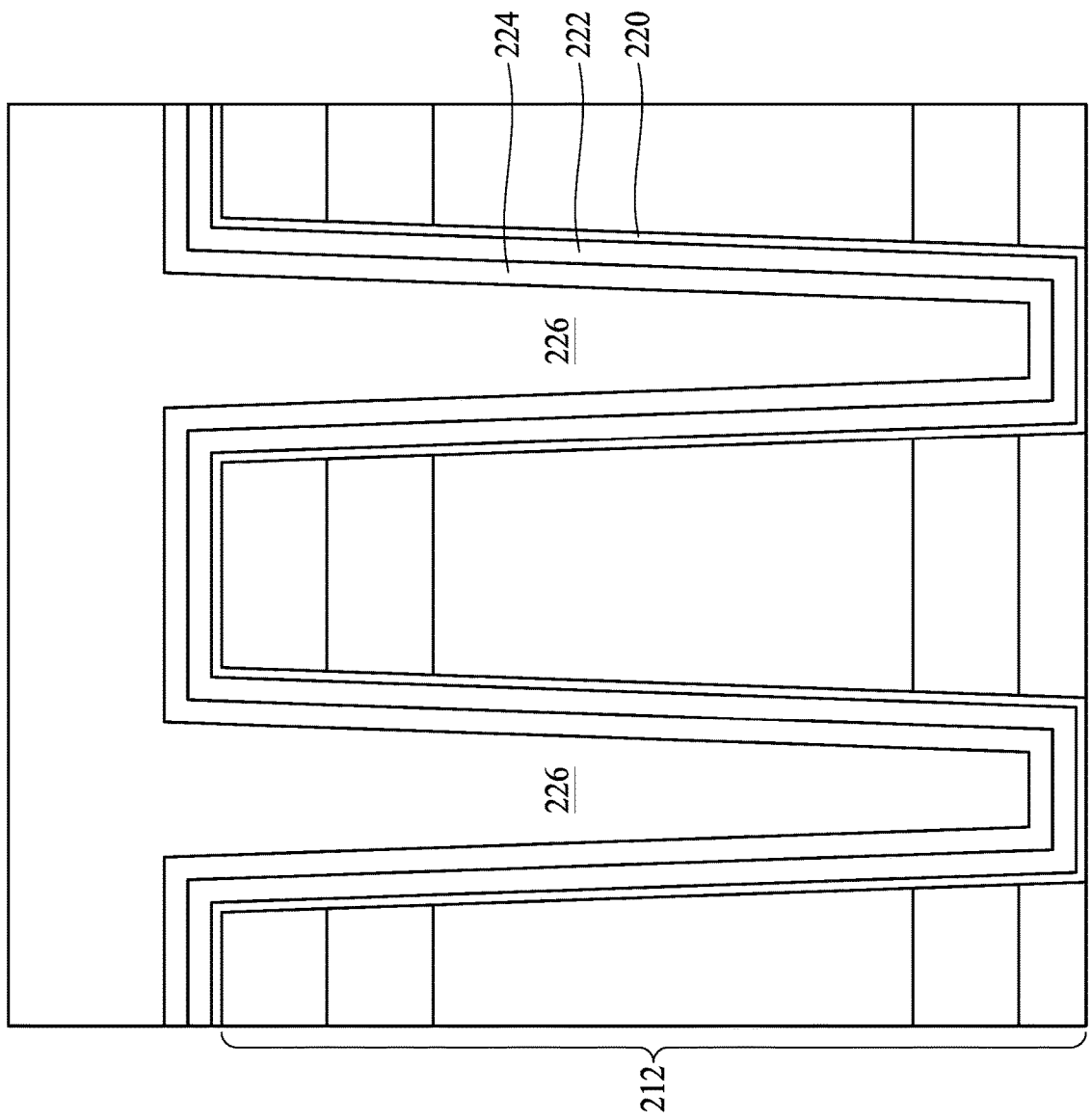

Referring to FIG. 7B, in some embodiments, a metal layer 220 can be formed. In some embodiments, the metal layer 220 can be a diffusion barrier layer formed to prevent metal diffusion into the surrounding dielectric structure 212. In some embodiments, the metal layer 220 can be an adhesive layer formed to improve adhesion between the dielectric structure 212 and the subsequently-formed metal layers. As shown in FIG. 7B, the metal layer 220 is usually deposited on the inner walls of the opening 214. For example, a bottom and sidewalls of the opening 214 are covered by the metal layer 220. Further, the metal layer 220 may cover a top surface of the dielectric structure 212. In some embodiments, the metal layer 220 serving as the diffusion barrier layer can include titanium (Ti), titanium nitride (TiN), tantalum (Ta), tantalum nitride (TaN), or other materials. In some embodiments, the metal layer 220 serving as an adhesion layer can include a self-assembled monolayer (SAM). A self-assembled monolayer can be formed, for example, by a thermal process treatment that includes an organometallic chemical-containing gas.

Still referring to FIG. 7B, in operation 32, a liner 222 can be formed to cover the bottom and the sidewalls of the opening 214. Further, the liner 222 may cover the top surface of the dielectric structure 212. In some embodiments, the liner 222 also covers the metal layer 220, as shown in FIG. 7B, but the disclosure is not limited thereto. The liner 222 can include noble metals such as rhenium, rhodium or ruthenium, but the disclosure is not limited thereto. For example, a ruthenium liner 222 is used in the method for forming the interconnect structure. In some embodiments, a thickness of the ruthenium liner 222 is between approximately 5 angstroms (Å) and approximately 50 Å, but the disclosure is not limited thereto.

In some embodiments, another metal layer 224 can be formed on the liner 222. The metal layer 224 can be a diffusion barrier layer, an adhesive layer, or a seed layer. In some embodiments, when the metal layer 224 serves as a seed layer, the metal layer 224 can include copper, nickel, molybdenum, platinum, or the like, and can be applied using PVD, CVD or ALD.

In operation 33, the opening 214 is filled with a conductive layer 226. As shown in FIG. 7B, the conductive layer 226 covers the metal layer 224, the liner 222 and the metal layer 220. The conductive layer 226 may include a low resistivity conductive material selected from the group of conductive materials including, but not limited to, copper and copper-based alloy.

Figure 7C:
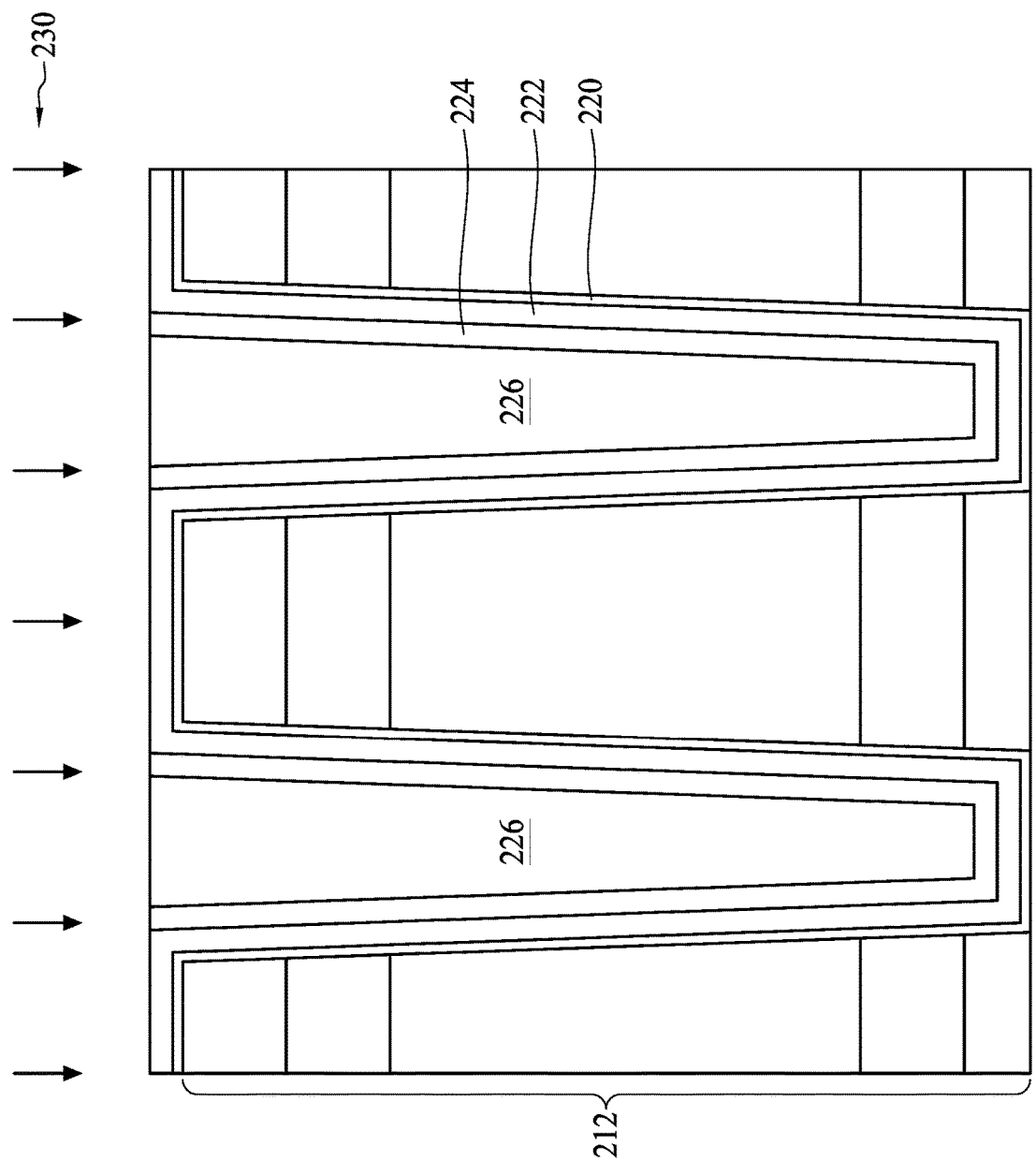

Referring to FIG. 7C, in operation 34, a first CMP operation 230 is performed to remove a portion of the conductive layer. Further, the first CMP operation 230 removes a portion of the metal layer 224. Consequently, the liner 224 is exposed as shown in FIG. 7C. It should be noted that because the liner 224 include noble metals, it is difficult to remove the liner 224 with the CMP operation 230 due to the inertness and mechanical hardness of the noble metals. In some embodiments, the liner 224 can serve as a stop layer for the first CMP operation 230. In some embodiments, a ratio of an exposed surface area of the liner 222 to a surface area of the dielectric structure 212 is greater than approximately 5%. In some embodiments, a ratio of the exposed surface area of the liner 222 to the surface area of the dielectric structure 212 is greater than approximately 10%. In some embodiments, a ratio of the exposed surface area of the liner 222 to a surface area of the wafer where the dielectric structure 212 is disposed is greater than approximately 5%. In some embodiments, a ratio of the exposed surface area of the liner 222 to the surface area of the wafer on which the dielectric structure 212 is disposed is greater than approximately 10%.

Figure 7D:
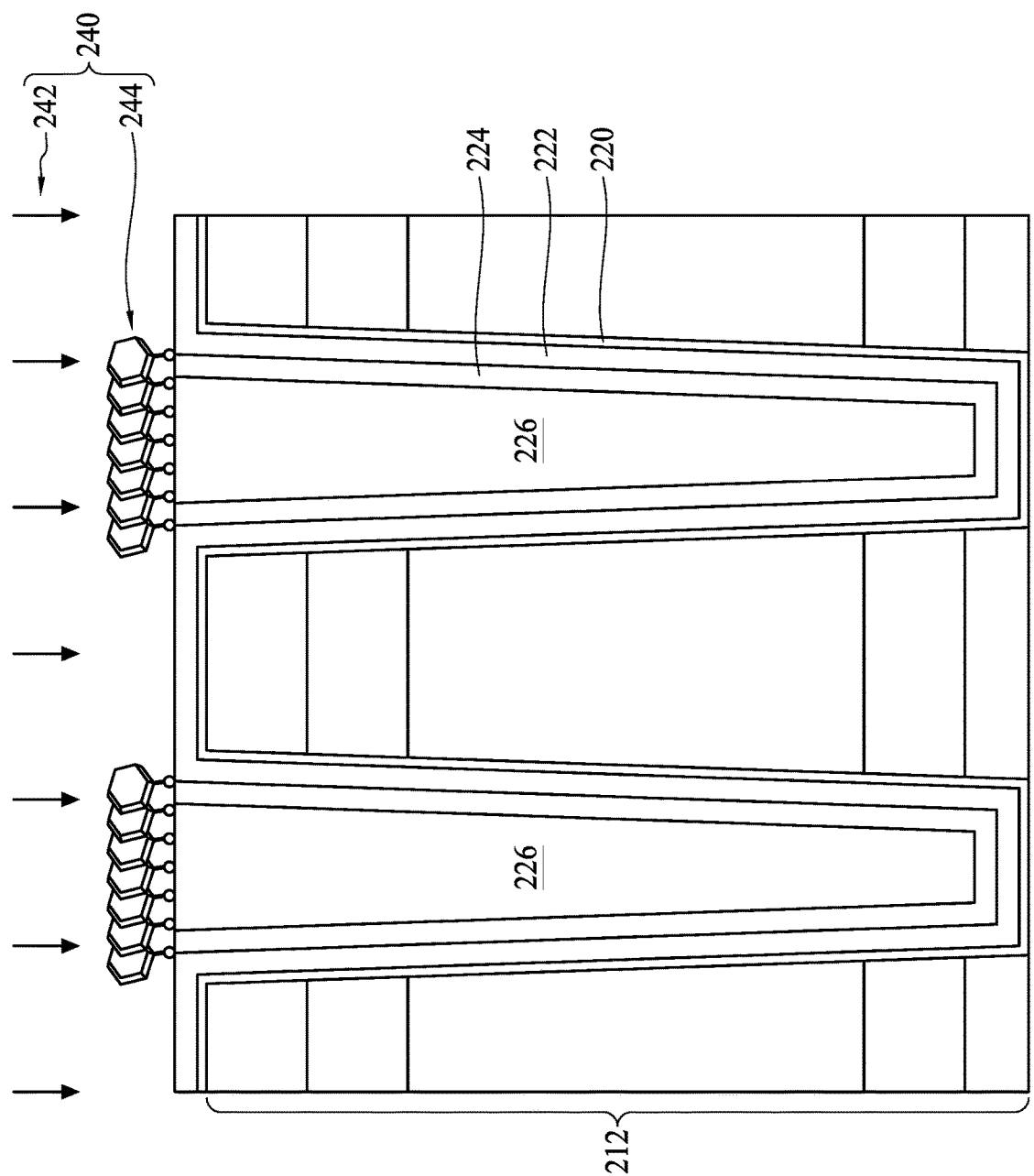
Figure 7E:
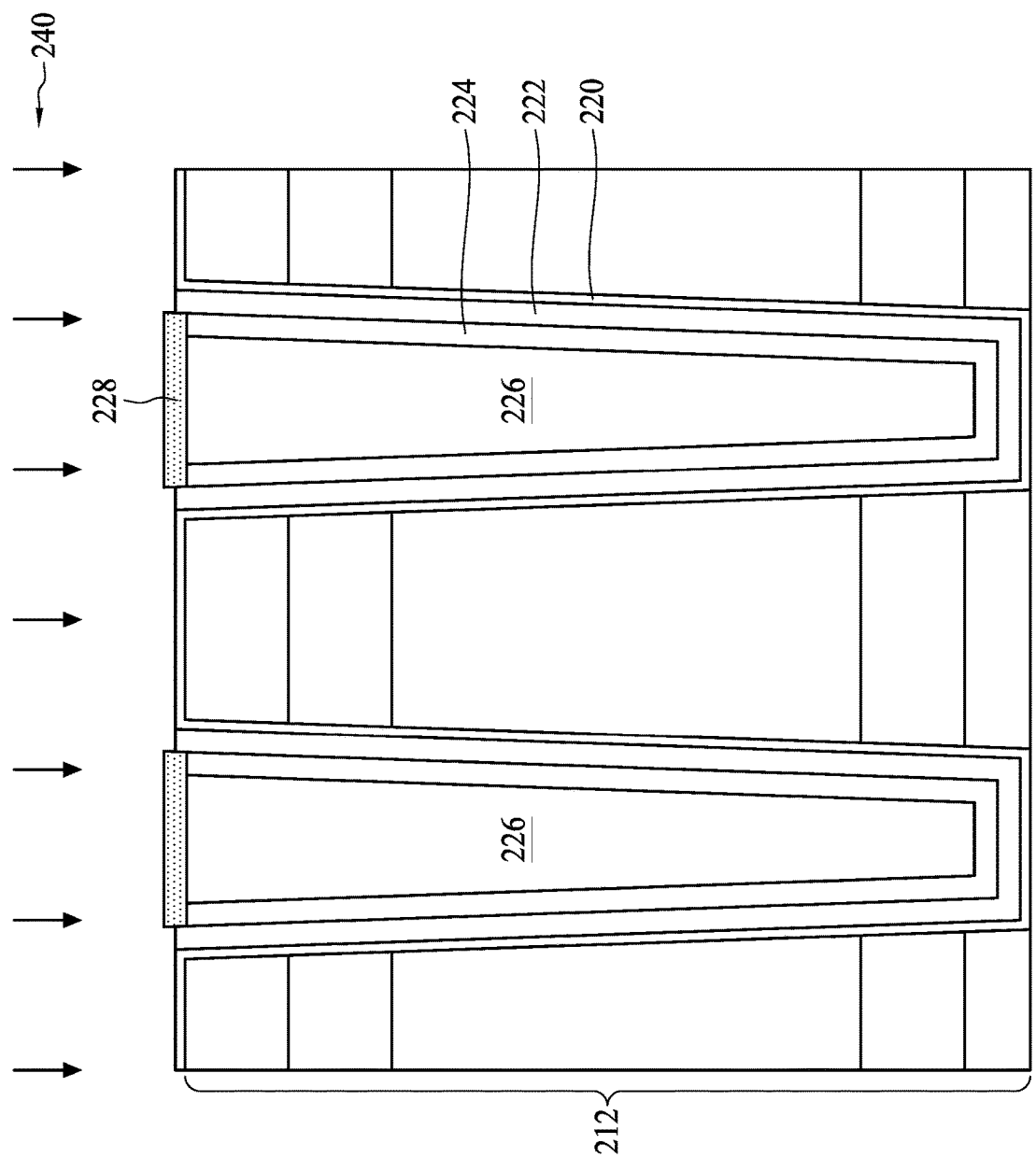

Referring to FIGS. 7D and 7E, in operation 35, a mixture 240 is provided. In some embodiments, the mixture 240 can include at least a first composition 242 and a second composition 244. As mentioned above, the first composition 242 includes a strong oxidant used to etch and remove the liner 222, while the second composition 244 reacts with the conductive layer 226 and the metal layer 224 to form a protecting layer 228 on a top surface of the conductive layer 226 and a top surface of the metal layer 224. As shown in FIG. 7E, the protecting layer 228 may protect the underlying conductive layer 226 during the etching of the liner 222. In some embodiments, after the etching of the liner 222, the previously underlying material, such as the metal layer 220 or the dielectric structure 212 may be exposed.

In some embodiments, a process duration of operation 35 is between approximately 15 seconds and approximately 10 minutes. In some comparative approaches, when the process duration of operation 35 is less than approximately 15 seconds, the liner 222 may remain on the surface of the dielectric structure 212, and thus subsequent operations may be impeded by the liner 222 due to its inertness and mechanical hardness. Further, the formed interconnect structure may suffer a short-circuit issue. In some comparative approaches, when the process duration of operation 35 is greater than approximately 10 minutes, the protecting layer 228 may be consumed and thus the conductive layer 226, which should be protected from the first composition 242, is damaged. Further, the formed interconnect structure may suffer the open-circuit issue.

Figure 7F:
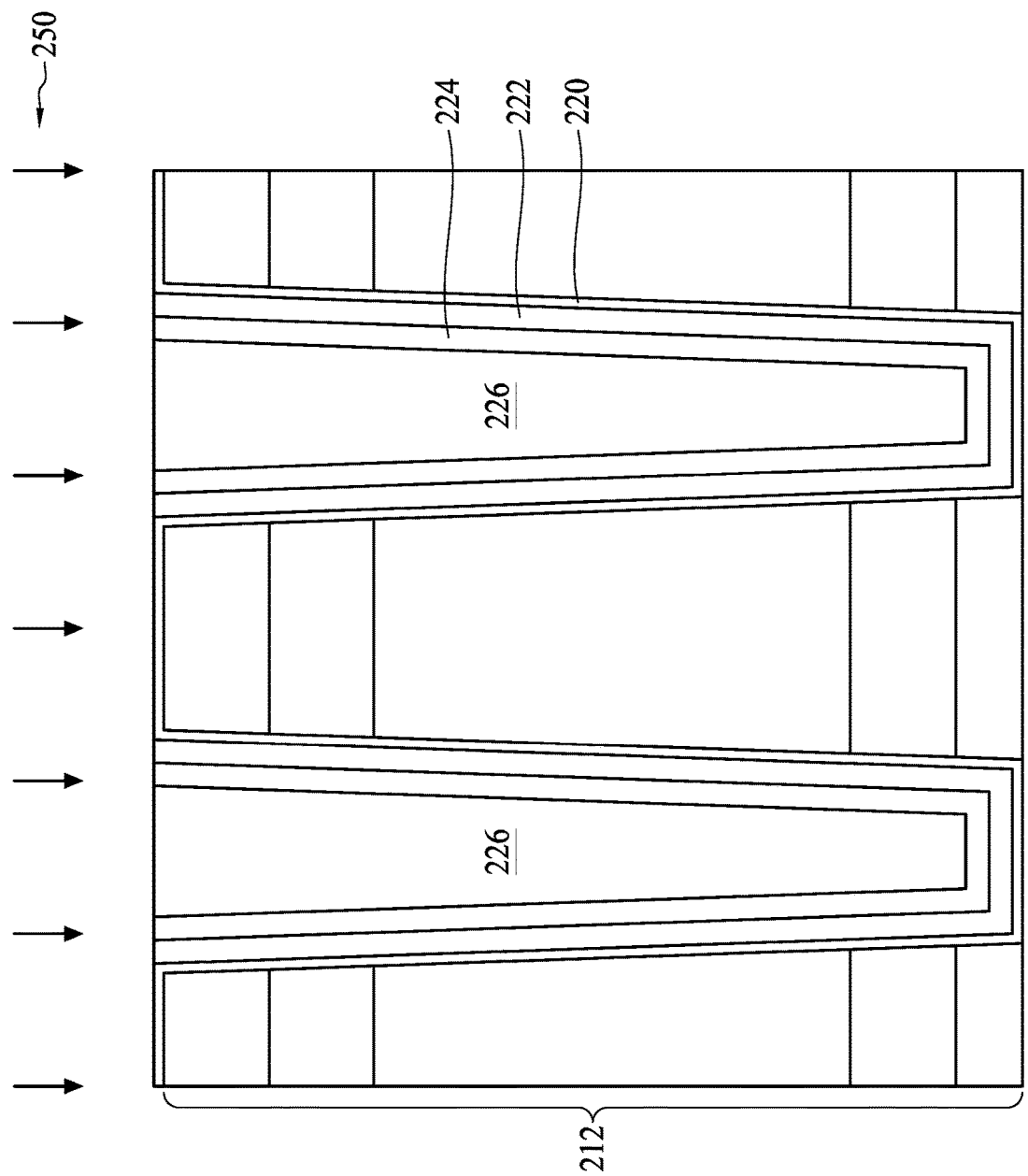

Referring to FIG. 7F, in some embodiments, a cleaning operation 250 can be performed to remove the mixture 240, the protecting layer 228 and other residue from the substrate. Accordingly, the conductive layer 226 can be exposed. The cleaning operation 250 helps to mitigate impact to the subsequent operation resulting from the etching of the liner 222.

Figure 7G:
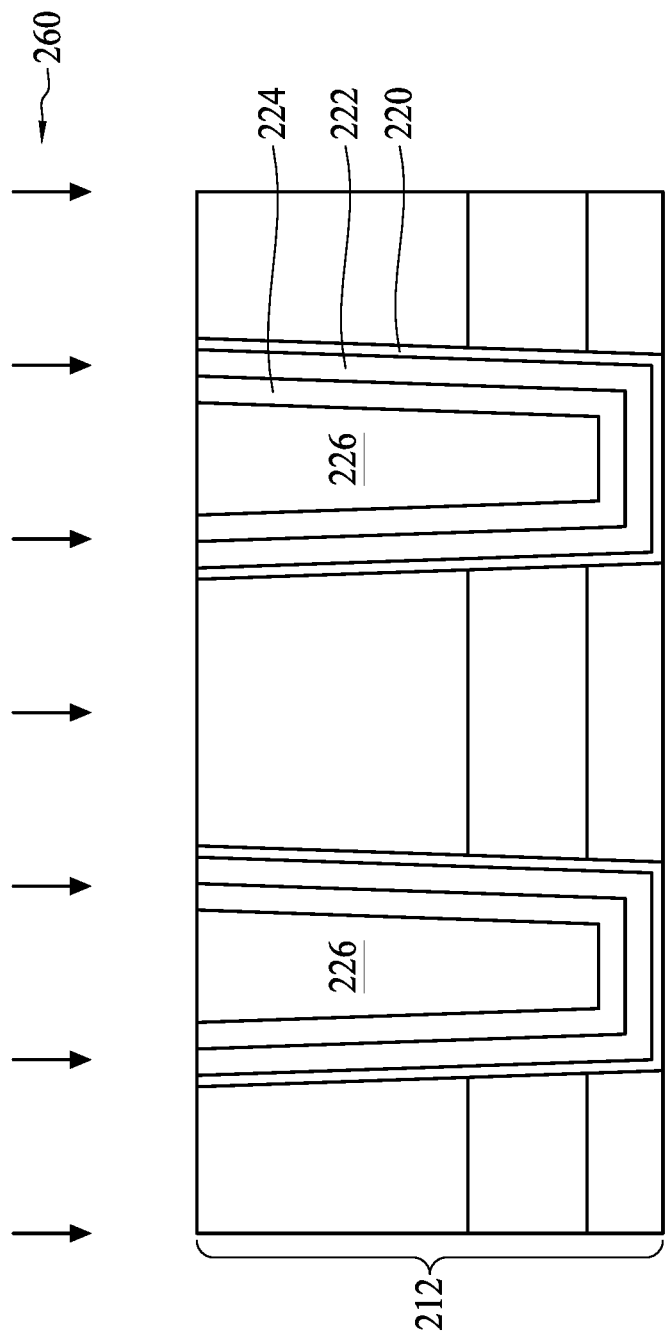
Figure 7H:
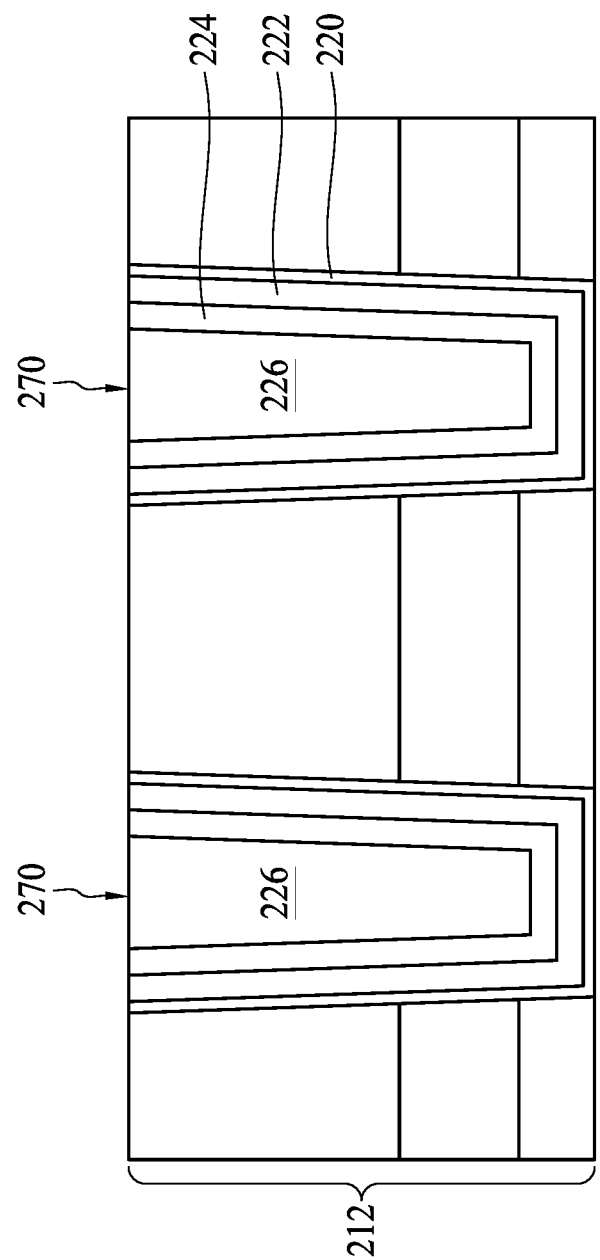

Referring to FIGS. 7G and 7H, in operation 36, a second CMP operation 260 is performed to remove a portion of the conductive layer 226, and to form an interconnect structure 270 (shown in FIG. 7H) in the dielectric structure 212. Further, a top surface of the interconnect structure 270 is substantially flush with a top surface of the dielectric structure 212. In some embodiments, an abrasive slurry used in the second CMP operation 260 can be the same as an abrasive slurry used in the first CMP operation 230, but the disclosure is not limited thereto.

It should be noted that the obtained interconnect structure 270 can be one of the metal layers labeled M1 through M4 and/or a plurality of conductors labeled V1 through V3 of the BEOL interconnect structure 210, as shown in FIG. 6. Further, by repeatedly performing operations 31 to 36, the BEOL interconnect structure 210 can be constructed.

Briefly speaking, the method for forming the interconnect structure 30 can be used to form the interconnect structure 270 of the BEOL interconnect structure 210, but the disclosure is not limited thereto. As mentioned above, the liner 222 including noble metals may be unable to be removed by the first CMP operation 230 (i.e., the Cu-CMP) due to the chemical inertness and mechanical hardness of the liner 222. Therefore, the first composition 242 in the mixture 240 is provided to etch and remove the liner 222 between the first CMP operation 230 and the second CMP operation 260. Further, the protecting layer 228, which serves to protect the conductive layer 226 during the etching of the liner 222, is formed by the second composition 244 in the mixture 240. Therefore, in operation 35, the liner 222 can be removed from the surface of the dielectric structure 212, while the conductive layer 226 under the protecting layer 228 can be protected in the same operation. The conductive layer 226 can then be removed by the second CMP operation 260 in operation 36. Accordingly, an interconnect structure 270 having a surface flush with the surface of the dielectric structure 212 can be obtained. Further, the short-circuit issue and the open-circuit issue of the BEOL interconnect structure 210 can both be mitigated.

The present disclosure therefore provides methods for CMP and a method for forming an interconnect structure. In some embodiments, an etchant (i.e., a composition including a strong oxidant) is used to remove a liner including noble metals while another composition is used to protect another metal layer, including a metal such as copper, during the removal of the liner. Accordingly, the liner can be removed while the other metal layer is protected. Accordingly, the superfluous liner and the conductive layer can be separately removed, and the short-circuit issue and the open-circuit issue can be both mitigated.

In some embodiments, a method for CMP is provided. The method includes following operations. A dielectric structure is received. The dielectric structure includes a metal layer stack formed therein. The metal layer stack includes at least a first metal layer and a second metal layer, and the first metal layer and the second metal layer are exposed through a surface of the dielectric structure. A first composition is provided to remove a portion of the first metal layer from the surface of the dielectric structure. A second composition is provided to form a protecting layer over the second metal layer. The protecting layer is removed from the second metal layer. A CMP operation is performed to remove a portion of the second metal layer. In some embodiments, the protecting layer protects the second metal layer during the removal of the portion of the first metal layer.

In some embodiments, a method for CMP is provided. The method for CMP include following operations. A substrate is received. The substrate includes at least a first metal layer and a second metal layer sequentially stacked in a dielectric structure. A first CMP operation is performed to remove a portion of the second metal layer to expose the first metal layer. A mixture is provided to form a protecting layer over the second metal layer and to etch the first metal layer from the surface of the dielectric structure. A second CMP operation is provided to remove a portion of the second metal layer and to form a flush surface over the dielectric structure and the second metal layer.

In some embodiments, a method for forming an interconnect structure is provided. The method include following operations. A substrate is received. The substrate includes a dielectric structure and an opening formed therein. A liner is formed to cover a bottom and sidewalls of the opening and to cover a top surface of the dielectric structure. The opening is filled with a conductive layer. In some embodiments, the conductive layer covers the liner. A mixture is provided to etch the liner from the top surface of the dielectric structure. A second CMP operation is performed to remove a portion of the conductive layer and to form an interconnect structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for chemical-mechanical polishing (CMP), comprising:
   receiving a dielectric structure comprising a metal layer stack formed therein, wherein the metal layer stack comprises at least a first metal layer and a second metal layer, and the first metal layer and the second metal layer are exposed through a surface of the dielectric structure;
   applying a first composition to form a protecting layer over the second metal layer;
   applying a second composition to etch a portion of the first metal layer to expose the surface of the dielectric structure, wherein the protecting layer protects the second metal layer during the removal of the portion of the first metal layer, and a top surface of the etched first metal layer is lower than a top surface of the protecting layer;
   removing the protecting layer from the second metal layer; and
   performing a CMP operation to remove a portion of the second metal layer.

2. The method of claim 1, wherein the second composition comprises halogen oxoacid or their salts.

3. The method of claim 1, wherein the first composition comprises benzotriazole (BTA), triazole derivatives, thioazole derivatives, and tetrazole derivatives.

4. The method of claim 1, wherein the applying of the first composition to form the protecting layer is performed prior to the applying of the second composition to remove the portion of the first metal layer.

5. The method of claim 1, wherein the first metal layer comprises noble metals.

6. A method for chemical-mechanical polishing (CMP), comprising:
   receiving a substrate comprising at least a first metal layer and a second metal layer sequentially stacked in a dielectric structure, wherein the first metal layer comprises noble metals;
   performing a first CMP operation to remove a portion of the second metal layer to expose the first metal layer;
   applying a mixture to form a protecting layer over the second metal layer and to etch the first metal layer from the surface of the dielectric structure, wherein a top surface of the etched first metal layer is lower than a top surface of the protecting layer; and
   performing a second CMP operation to remove a portion of the second metal layer and to form a flush surface over the dielectric structure and the second metal layer.

7. The method of claim 6, wherein an etching rate of the mixture on the first metal layer is greater than approximately 5 Å/min.

8. The method of claim 6, wherein the mixture comprises a first composition to etch the first metal layer and a second composition to form the protecting layer over the second metal layer during the etching of the first metal layer.

9. The method of claim 8, wherein a concentration of the second composition in the mixture is between approximately 1 ppm and approximately 100,000 ppm.

10. The method of claim 8, wherein a concentration of the first composition in the mixture is between approximately 100 ppm and approximately 20,000 ppm.

11. The method of claim 6, wherein a pH of the mixture is between approximately 5.0 and approximately 14.0.

12. A method for forming an interconnect structure, comprising:
    receiving a substrate comprising a dielectric structure and an opening formed in the dielectric structure;
    forming a liner covering a bottom and sidewalls of the opening and covering a top surface of the dielectric structure, wherein the liner comprises noble metals;
    filling the opening with a conductive layer, wherein the conductive layer covers the liner;
    performing a first CMP operation to remove a portion of the conductive layer to expose the liner;
    applying a mixture to etch the liner from the top surface of the dielectric structure and form a protecting layer over the conductive layer during the removal of the liner, wherein a top surface of the etched liner is lower than a top surface of the protecting layer; and
    performing a second CMP operation to remove a portion of the conductive layer and to form an interconnect structure.

13. The method of claim 12, wherein the liner has a surface exposed to the mixture, and a ratio of the surface area of the liner to the surface area of the dielectric structure is greater than approximately 5%.

14. The method of claim 12, wherein the mixture comprises a first composition and a second composition, the first composition removes the liner, and the second composition forms the protecting layer over the conductive layer during the removal of the liner.

15. The method of claim 12, further comprising forming a diffusion barrier layer between the liner and the dielectric structure, wherein the diffusion barrier layer is removed by the second CMP operation.

16. The method of claim 1, wherein a top surface of the dielectric layer, the top surface of the first metal layer, and a top surface of the second metal layer form a flush surface after the performing of the CMP operation.

17. The method of claim 6, further comprising removing the protecting layer to expose the second metal layer prior to the performing of the second CMP operation.

18. The method of claim 12, further comprising performing a cleaning operation prior to the performing of the second CMP operation.

19. The method of claim 2, wherein the second composition comprises periodic acid ($H_5IO_6$) or periodate, perbromic acid ($HBrO_4$) or perbormate, perchloric acid ($HClO_4$) or perchlorate, or chlorite and chlorate, bromite and bromate.

20. The method of claim 1, wherein a process duration of the applying of the second composition is between approximately 15 seconds and approximately 10 minutes.

* * * * *